(12) United States Patent
Chiu et al.

(10) Patent No.: US 12,396,255 B2
(45) Date of Patent: Aug. 19, 2025

(54) MULTIPLE BACK SIDE/BURIED POWER RAIL (BPR) CELL INCLUDING FIELD-EFFECT TRANSISTORS WITH AIR VOID BETWEEN TWO ADJACENT BPR CELLS

(71) Applicant: Taiwan Semiconductor Manufacturing Company, Ltd., Hsinchu (TW)

(72) Inventors: Te-Hsin Chiu, Miaoli County (TW); Kam-Tou Sio, Zhubei (TW); Jiann-Tyng Tzeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/673,632

(22) Filed: May 24, 2024

(65) Prior Publication Data

US 2024/0321890 A1    Sep. 26, 2024

Related U.S. Application Data

(63) Continuation of application No. 18/149,128, filed on Jan. 2, 2023, now Pat. No. 12,021,083, which is a
(Continued)

(51) Int. Cl.
*H10D 84/85* (2025.01)
*H01L 21/764* (2006.01)
(Continued)

(52) U.S. Cl.
CPC ......... *H10D 84/853* (2025.01); *H01L 21/764* (2013.01); *H01L 23/5286* (2013.01);
(Continued)

(58) Field of Classification Search
CPC ............. H01L 29/785; H01L 29/42392; H01L 21/764; H01L 29/0653; H01L 29/0649;
(Continued)

(56) References Cited

U.S. PATENT DOCUMENTS 11,545,491 B2 *   1/2023   Chiu .................. H01L 29/0673
2016/0133632 A1   5/2016   Park et al.
(Continued)

OTHER PUBLICATIONS

Non-Final Office Action on U.S. Appl. No. 17/199,539 dtd May 17, 2022.
(Continued)

*Primary Examiner* — Changhyun Yi
(74) *Attorney, Agent, or Firm* — FOLEY & LARDNER LLP

(57) ABSTRACT

A semiconductor device includes a semiconductor substrate. The semiconductor device includes a first fin protruding from the semiconductor substrate and extending along a first direction. The semiconductor device includes a second fin protruding from the semiconductor substrate and extending along the first direction. A first epitaxial source/drain region coupled to the first fin and a second epitaxial source/drain region coupled to the second fin are laterally spaced apart from each other by an air void.

20 Claims, 26 Drawing Sheets

Related U.S. Application Data continuation of application No. 17/199,539, filed on Mar. 12, 2021, now Pat. No. 11,545,491.

(51) Int. Cl.
| | | |
|---|---|---|
| *H01L 23/528* | (2006.01) |
| *H10D 30/01* | (2025.01) |
| *H10D 30/62* | (2025.01) |
| *H10D 30/67* | (2025.01) |
| *H10D 62/10* | (2025.01) |
| *H10D 64/01* | (2025.01) |

(52) U.S. Cl.
CPC ....... *H10D 30/024* (2025.01); *H10D 30/6211* (2025.01); *H10D 30/6735* (2025.01); *H10D 62/116* (2025.01); *H10D 62/121* (2025.01); *H10D 64/017* (2025.01)

(58) Field of Classification Search
CPC .......... H01L 29/78696; H01L 27/0924; H10D 84/853; H10D 30/6735; H10D 64/017; H10D 30/6211; H10D 62/116; H10D 62/121

See application file for complete search history.

(56) References Cited

U.S. PATENT DOCUMENTS

| | | | |
|---|---|---|---|
| 2018/0308742 A1 | 10/2018 | Cheng et al. | |
| 2019/0287864 A1 | 9/2019 | Cheng et al. | |
| 2019/0378903 A1* | 12/2019 | Jeon | H01L 27/088 |
| 2020/0365692 A1* | 11/2020 | Jung | H01L 29/0673 |
| 2020/0373331 A1* | 11/2020 | Kim | H01L 21/76898 |

OTHER PUBLICATIONS

Non-Final Office Action on U.S. Appl. No. 18/149,128 dtd Sep. 28, 2023.
Notice of Allowance on U.S. Appl. No. 17/199,539 dtd Aug. 30, 2022.
Notice of Allowance on U.S. Appl. No. 18/149,128 dtd Feb. 20, 2024.

\* cited by examiner

MULTIPLE BACK SIDE/BURIED POWER RAIL (BPR) CELL INCLUDING FIELD-EFFECT TRANSISTORS WITH AIR VOID BETWEEN TWO ADJACENT BPR CELLS

CROSS-REFERENCE TO RELATED APPLICATION

This application is a continuation of U.S. patent application Ser. No. 18/149,128, filed Jan. 2, 2023, which is a continuation application of U.S. patent application Ser. No. 17/199,539, filed Mar. 12, 2021, the entire contents of each of which are incorporated herein by reference for all purposes.

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises one or more fins protruding from a substrate. A gate structure, configured to control the flow of charge carriers within a conductive channel of the FinFET device, wraps around the one or more fins. For example, in a tri-gate FinFET device, the gate structure wraps around three sides of each of the one or more fins, thereby forming conductive channels on three sides of each of the one or more fins.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
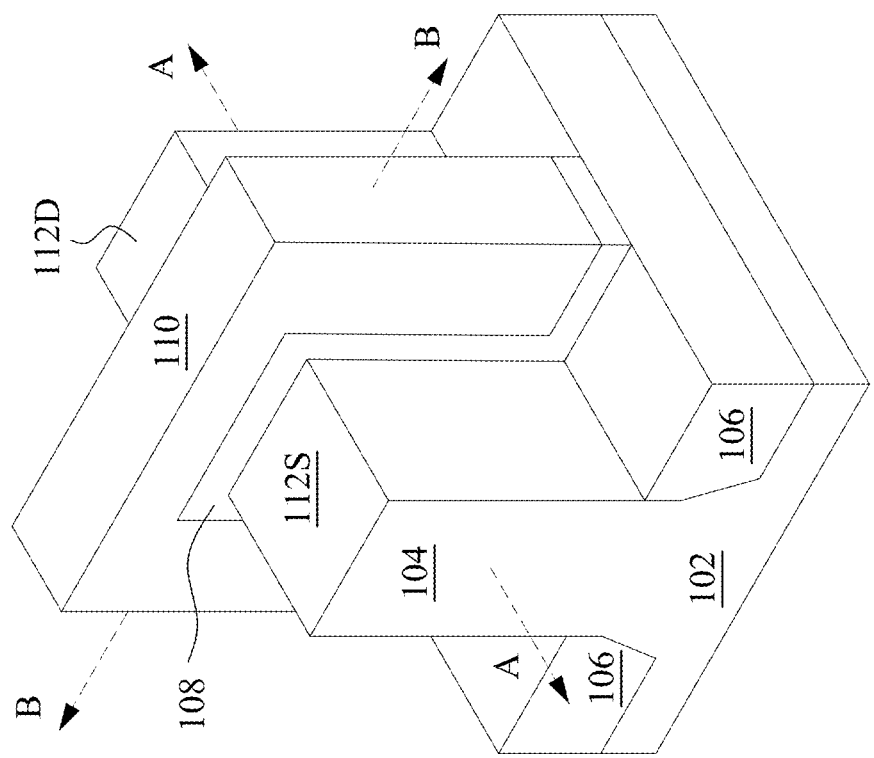
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about" and "substantially" can indicate a value of a given quantity that varies within 5% of the value (e.g., ±1%, ±2%, ±3%, ±4%, ±5% of the value).

The semiconductor integrated circuit (IC) industry has experienced exponential growth. In semiconductor IC design, standard cells methodologies are commonly used for the design of semiconductor devices on a chip. Standard cell methodologies use standard cells as abstract representations of certain functions to integrate millions, or billions, devices on a single chip. As ICs continue to scale down, more and more devices are integrated into the single chip. This scaling down process generally provides benefits by increasing production efficiency and lowering associated costs.

With the trend of scaling down the ICs, in general, the area of a standard cell is scaled down accordingly. The area of the standard cell can be scaled down by reducing a cell width of the cell and/or a cell height of the cell. The cell width is typically proportional to a number of gate structures or features (e.g., typically known as "POLY"), extending along a vertical direction, that the cell can contain; and the cell height is typically proportional to a number of signal tracks, extending along a horizontal direction, that the cell can contain.

To effectively reduce the total area of the cell, a trade-off between the cell width and cell height typically exists. For example, while reducing the cell height (e.g., by decreasing the number of signal tracks), the cell width (the number of gate structures) may be subjected to being increased. In this regard, the concept of moving some of interconnect structures, which are typically disposed on the front side of a substrate (or wafer), to its back side has been proposed. For example, the interconnect structures configured to provide power signals (typically known as VDD (high voltage)

power rail and VSS (ground) power rail) can be formed on the back side of the substrate. In this way, the cell height of a corresponding cell can be reduced, while not being subjected to the increase of cell width. The cell containing such "back side" interconnect structures is generally referred to as a back side/buried power rail (BPR) cell. Although the area of each cell can be effectively reduced, it is noted that when an IC includes multiple BPR cells abutted to each other, some issues may arise. For example, cross-coupling (or sometimes referred to as cross-talk) of the respective conductive features (e.g., source/drain regions, active gate structures, etc.) of adjacent BPR cells becomes noticeable, which can induce noise. In turn, overall performance of the IC can be negatively impacted.

Embodiments of the present disclosure are discussed in the context of forming an integrated circuit including a number of non-planar transistors, and in particular, in the context of forming a number of FinFET devices configured as BPR cells. For example, multiple BPR cells may be used to collectively form an integrated circuit. Each of the BPR cells can include one or more FinFET devices. The BPR cells may abut to each other. By replacing a dielectric typically disposed between the conductive features of two adjacent BPR cells with an air gap or air void, cross-coupling between the conductive features can be significantly reduced. This is because the cross-coupling (e.g., quantized as a capacitance) is positively proportional to the dielectric constant of a material disposed between the conductive features and the air has a much lower dielectric constant (e.g., 1) than the dielectric (e.g., 3.9 or higher). As such, performance of the BPR cells can be improved. For example, speed of the BPR cells can be increased by about 20%~50%. In some embodiments, the air void can be formed by cutting (or otherwise removing) a dummy fin disposed between the conductive features to form a trench with a relatively low aspect ratio (width to height). Next, the trench can be sealed (or otherwise capped) by a dielectric protection layer. Given the low aspect ratio, a portion of the air void, which is disposed between the conductive features, remains after depositing the dielectric protection layer, thereby minimizing the cross-coupling between the conductive features.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions 112S/112D. Cross-section C-C is parallel to cross-section B-B and is across the source/drain region 112S/112D. Subsequent figures refer to these reference cross-sections for clarity.

Figure 2:
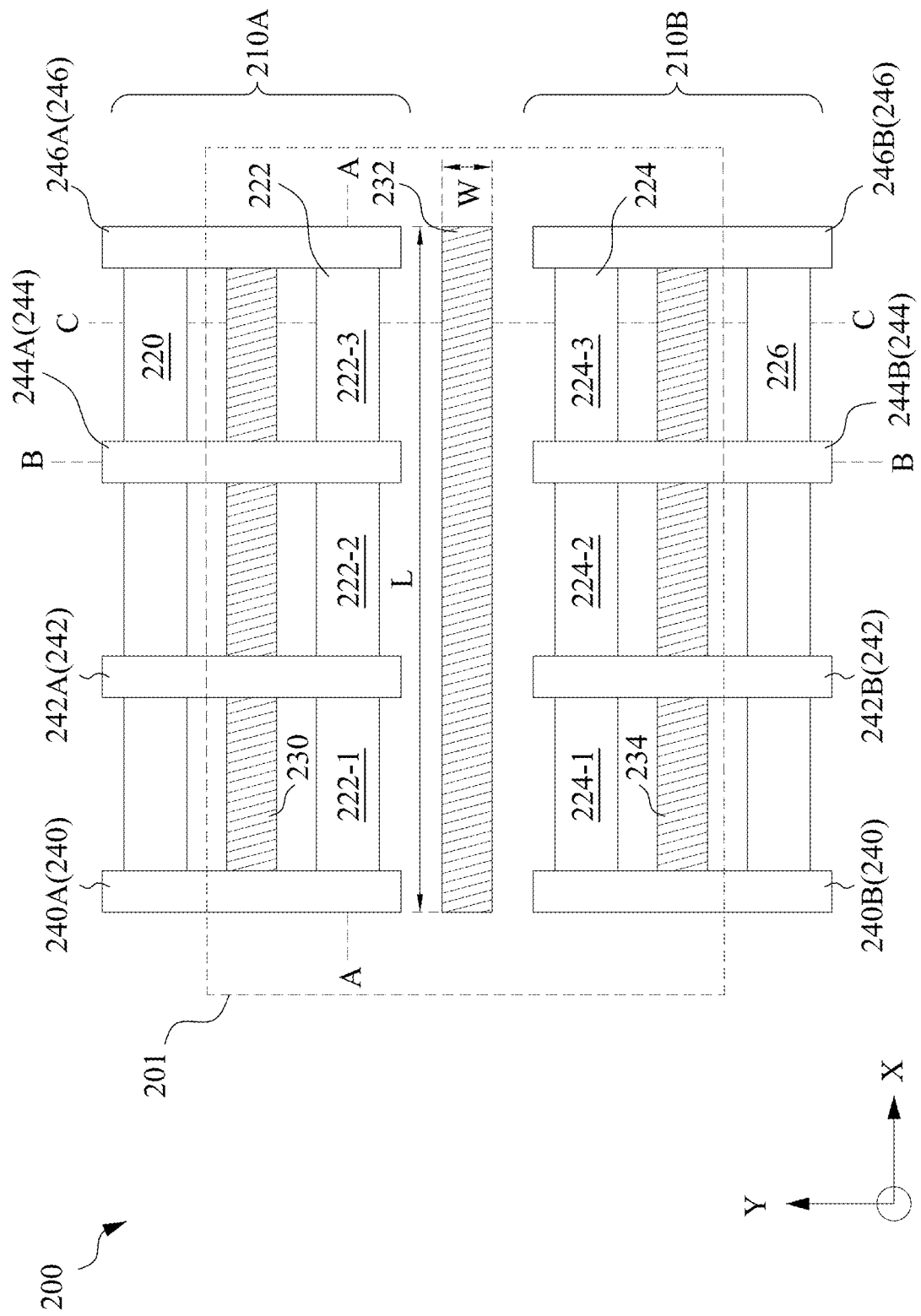
FIG. 2 illustrates an example layout design including two abutted cells, in accordance with some embodiments.

Referring to FIG. 2, an example layout design 200 of an integrated circuit is depicted, in accordance with some embodiments. The layout design 200 includes two (standard) cells, 210A and 210B, abutted to each other along the Y direction. The cells 210A and 210B may sometimes be referred to as a top cell and a bottom cell, respectively. Each of the cells 210A-B may function as a respective circuit of the integrated circuit. Each of the circuits may include one or more transistors operatively coupled to one another. For example, each of the cells 210A and 210B can be used to fabricate one or more transistors that collectively perform a function of the respective circuit. It is appreciated that the layout design 200 is simplified to include only the patterns used to form major features of each of the transistors (e.g., gate structures, source/drain regions). Thus, the layout design 200 can include other patterns to form various features (e.g., interconnection structures) of the respective circuits while remaining within the scope of the present disclosure.

The layout design 200 includes patterns 220, 222, 224, and 226. The patterns 220-226 may extend along the X direction, each of which is configured to form an active region over a substrate (hereinafter "active regions 220-226"). Such an active region may form a fin-shaped region of one or more three-dimensional field-effect-transistors (e.g., FinFETs), a sheet-shaped region of one or more gate-all-around (GAA) transistors (e.g., nanosheet transistors), a wire-shaped region of one or more GAA transistors (e.g., nanowire transistors), or an oxide-definition (OD) region of one or more planar metal-oxide-semiconductor field-effect-transistors (MOSFETs). The active region may serve as a source feature or drain feature (or region) of the respective transistor(s). In an example where the layout design 200 is used to fabricate one or more FinFETs (e.g., the FinFET device 100 shown in FIG. 1), each of the active regions 220-226 forms an active fin (e.g., 104) protruding from a substrate (e.g., 102) and extending along the X direction (e.g., cross-section A-A). It is noted that the Y direction in FIG. 2 is parallel with the cross-sections B-B and C-C shown in FIG. 1; and the X direction in FIG. 2 is parallel with the cross-section A-A shown in FIG. 1. The term "active fin" is referred to as a fin that will be adopted as an active channel to electrically conduct current in a finished semiconductor device, when appropriately configured and powered.

The layout design 200 includes patterns 230, 232, and 234. The patterns 230-234 may also extend along the X direction, each of which is configured to form a dummy region over the same substrate (hereinafter "dummy regions 230-234"). The dummy regions 230-234 may be disposed alternately between the active regions 220-226, as shown in FIG. 2. Continuing with the above example where the layout design 200 is used to fabricate one or more FinFETs (e.g., the FinFET device 100 shown in FIG. 1), each of the dummy regions 230-234 can be configured as a respective dummy fin, which is formed of a dielectric material. The term "dummy fin" is referred to as a fin that will not be adopted as an active channel (sometimes referred to as a dummy channel) to electrically conduct current in a finished semiconductor device. In the example of FIG. 2, between adjacent ones of the active regions 220-226, one of the dummy regions 230-234 may be disposed.

The layout design 200 includes patterns 240, 242, 244, and 246. The patterns 240-246 may extend along the Y direction, that are configured to form gate structures (hereinafter "gate structures 240-246"). In an embodiment, the gate structures 240-246 may be initially formed as dummy (e.g., polysilicon) gate structures straddling respective portions of the active regions 220-226, and be later replaced by active (e.g., metal) gate structures. The gate structure 240 may be disposed along or over a first boundary of the layout design 200 (or the cell(s)), and the gate structure 246 may be disposed along or over a second boundary of the layout design 200 (or the cell(s)). The gate structures 240 and 246 may not provide an electrical or conductive path, and may prevent or at least reduce/minimize current leakage across components between which the gate structures 240 and 246 are located. The gate structures 240 and 246 can include polysilicon lines or metal lines, which are sometimes referred to as poly on OD edge (PODEs). Such PODEs and the underlying active/dummy regions may be replaced with a dielectric material so as to electrically isolate the cells 210A-B from cells laterally (e.g., along the X direction) abutted to them. Each of the remaining gate structures 242 and 244, formed of one or more conductive materials (e.g., polysilicon(s), metal(s)), can overlay (e.g., straddle) respective portions of the active regions 220-226 to define one or more transistors. Continuing with the above example where the layout design 200 is used to fabricate one or more FinFETs (e.g., the FinFET device 100 shown in FIG. 1), each of the gate structures 242 and 244 may correspond to a metal gate (e.g., 110) straddling (or otherwise overlaying) portions of the active regions 220-226, with the non-overlapped portions of the active regions such as, 222-1, 222-2, 222-3, 224-1, 224-2, and 224-3 serving as respective source/drain regions (e.g., 112S, 112D) of the one or more FinFETs.

The active regions 220 and 222, including the dummy region 230 disposed therebetween, may belong to the top cell 210A; and the active regions 224 and 226, including the dummy region 234 disposed therebetween, may belong to the bottom cell 210B. The gate structures 240-246 extending across the top and bottom cells, 210A-B, may be cut during fabrication of the integrated circuit. As such, each of the gate structures 240-246 includes at least two portions that belong to the top cell 210A and bottom cell 210B, respectively (as indicated by dotted lines in FIG. 2).

For example, the gate structure 240 includes portion 240A belonging to the top cell 210A, and portion 240B belonging to the bottom cell 210B; the gate structure 242 includes portion 242A belonging to the top cell 210A, and portion 242B belonging to the bottom cell 210B; the gate structure 244 includes portion 244A belonging to the top cell 210A, and portion 244B belonging to the bottom cell 210B; and the gate structure 246 includes portion 246A belonging to the top cell 210A, and portion 246B belonging to the bottom cell 210B.

After the gate structures 240-246 are cut, a trench disposed between the cells 210A-B, (along the Y direction) and across the gate structures 240-246 (along the X direction) can be formed. The trench can expose the dummy region 232, disposed between the active region 222 of the top cell 210A and the active region 224 of the bottom cell 210B. Upon being exposed, the dummy region 232 can be removed to form a trench with a relatively low aspect ratio (a ratio of width extending along the Y direction to height extending along the Z direction). A top portion of the trench is then capped by a dielectric protection layer, which results in an air void formed between respective source/drain regions of the cells 210A and 210B such as, for example, between source/drain regions 222-1 and 224-1, between source/drain regions 222-2 and 224-2, and between source/drain regions 222-3 and 224-3. Consequently, the cross-coupling between the respective source/drain regions of the cells 210A-B can be significantly reduced. Details of formation of the air void will be discussed below.

In accordance with various embodiments, the air void may inherit dimensions of the trench between the cells 210A-B and across the gate structures 240-246. For example, the air void may have a width, W, along the Y direction and a length, L, along the X direction. In some embodiments, W can range from one times a width of the gate structures 240-246 along the X direction (which is sometimes referred to as a "critical dimension (CD)" of the gate structures 240-246) to about 3 times the CD. In some embodiments, L can range from one times a distance of adjacent gate structures 240-246 along the X direction (which is sometimes referred to as a "pitch" of the gate structures 240-246) to about 50 times the pitch.

In accordance with various embodiments, each of the cells 210A and 210B may be configured as a back side power rail (BPR) cell, in which the power rails are formed on a side of the substrate opposite to a side where the active regions 220-226, dummy regions 230-234, and the gate structures 240-246 are formed. Thus, the patterns used to form the back side power rails are omitted in the layout design 200 of FIG. 2, for purposes of clarity of illustration.

Figure 3:
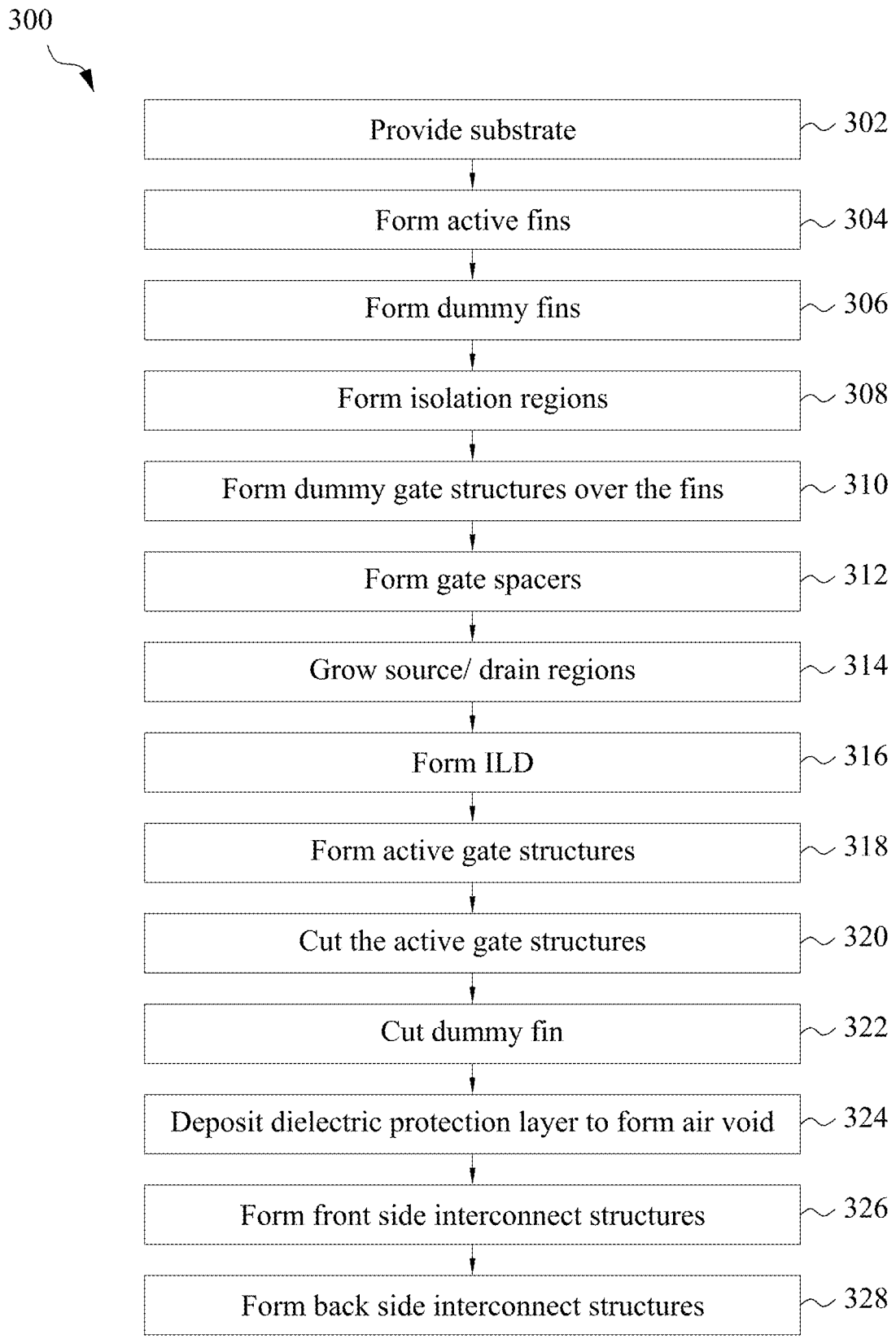
FIG. 3 illustrates a flow chart of an example method for making a non-planar transistor device, in accordance with some embodiments.

FIG. 3 illustrates a flowchart of a method 300 to form a non-planar transistor device, according to one or more embodiments of the present disclosure. For example, at least some of the operations (or steps) of the method 300 can be used to form a FinFET device (e.g., FinFET device 100), a nanosheet transistor device, a nanowire transistor device, a vertical transistor device, or the like. It is noted that the method 300 is merely an example, and is not intended to limit the present disclosure. Accordingly, it is understood that additional operations may be provided before, during, and after the method 300 of FIG. 3, and that some other operations may only be briefly described herein. In some embodiments, operations of the method 300 may be associated with cross-sectional views of an example FinFET device at various fabrication stages as shown in FIGS. 4, 5, 6, 7, 8, 9, 10, 11A, 11B, 12A, 12B, 13A, 13B, 14A, 14B, 15A, 15B, 16A, 16B, 17, and 18, respectively, which will be discussed in further detail below.

In brief overview, the method 300 starts with operation 302 of providing a substrate. The method 300 continues to operation 304 of forming active fins. The method 300 continues to operation 306 of forming dummy fins. The method 300 continues to operation 308 of forming isolation regions. The method 300 continues to operation 310 of forming dummy gate structures over the fins. The dummy gate structures each include a dummy gate dielectric and a dummy gate disposed above the dummy gate dielectric. The method 300 continues to operation 312 of forming gate spacers. The gate spacer is extended along sidewalls of each of the dummy gate structures. The method 300 continues to operation 314 of growing source/drain regions. The method 300 continues to operation 316 of forming an interlayer dielectric (ILD). The method 300 continues to operation 318 of forming active gate structures. The method 300 continues to operation 320 of cutting the active gate structures. The method 300 continues to operation 322 of cutting at least one of the dummy fins. The method 300 continues to operation 324 of depositing a dielectric protection layer to form an air void. The method 300 continues to operation 326 of forming front side interconnect structures. The method 300 continues to operation 328 of forming back side interconnect structures.

As mentioned above, FIGS. 4-18 each illustrate, in a cross-sectional view, a portion of a FinFET device 400 at various fabrication stages of the method 300 of FIG. 3. The FinFET device 400 is substantially similar to the FinFET device 100 shown in FIG. 1, but with multiple gate structures and multiple fins. Further, the portion of the FinFET device 400 shown in FIGS. 4-18 may be formed based on a portion of the layout design 200 of FIG. 2, e.g., portion 201 enclosed by dotted lines.

For example, FIGS. 4-9, 13B, 14A, 15A, and 16A illustrate cross-sectional views of the FinFET device 400 along cross-section B-B (as indicated in FIGS. 1 and 2); FIGS. 10, 11A, 12A, and 13A illustrate cross-sectional views of the FinFET device 400 along cross-section A-A (as indicated in FIGS. 1 and 2); and FIGS. 11B, 12B, 14B, 15B, 16B, 17, and 18 illustrate cross-sectional views of the FinFET device 400 along cross-section C-C (as indicated in FIGS. 1 and 2). Although FIGS. 4-18 illustrate the FinFET device 400, it is understood the FinFET device 400 may include a number of other devices such as inductors, fuses, capacitors, coils, etc., which are not shown in FIGS. 4-18, for purposes of clarity of illustration.

Figure 4:
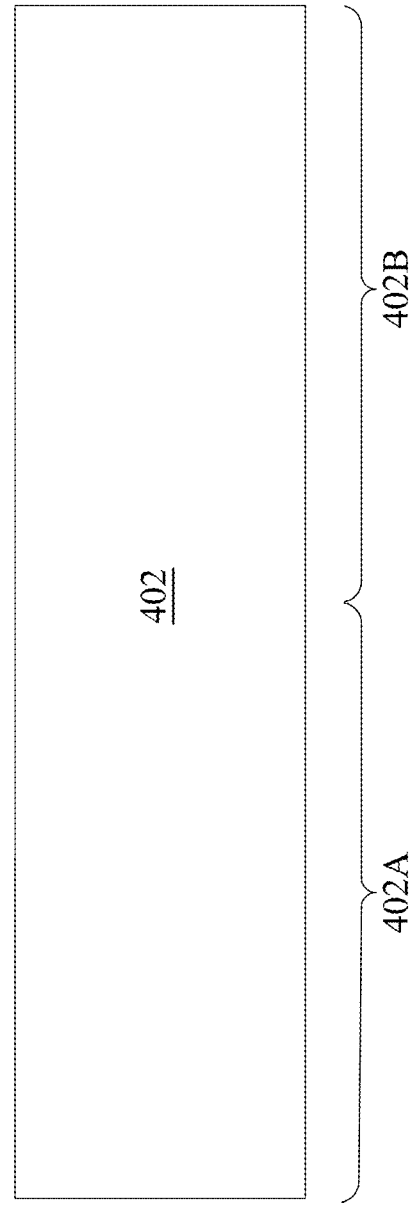
FIGS. 4, 5, 6, 7, 8, 9, 10, 11A, 11B, 12A, 12B, 13A, 13B, 14A, 14B, 15A, 15B, 16A, 16B, 17, and 18 illustrate cross-sectional views of an example FinFET device (or a portion of the example FinFET device) during various fabrication stages, made by the method of FIG. 3, in accordance with some embodiments.

Corresponding to operation 302 of FIG. 3, FIG. 4 is a cross-sectional view of the FinFET device 400 including a semiconductor substrate 402 at one of the various stages of fabrication. The view of FIG. 4 is cut along cross-section B-B, as indicated in FIGS. 1 and 2.

The substrate 402 may be a semiconductor substrate, such as a bulk semiconductor, a semiconductor-on-insulator (SOI) substrate, or the like, which may be doped (e.g., with a p-type or an n-type dopant) or undoped. The substrate 402 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 402 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 402 can include areas 402A and 402B, as shown in FIG. 4. The area 402A can be configured to form one or more FinFETs that collectively function as a first circuit; and the area 402B can be configured to form one or more FinFETs that collectively function as a second circuit. The first circuit may be represented by a first standard cell, e.g., the cell 210A of FIG. 2; and the second circuit may be represented by a second standard cell, e.g., the cell 210B of FIG. 2. The cells 210A and 210B can be abutted to each other along the Y direction, as shown in FIG. 2. It is understood that the substrate 402 can include any number of areas, each of which is configured to form one or more FinFETs that can be represented by a respective standard cell. Such standard cells can be abutted to one another.

Figure 5:
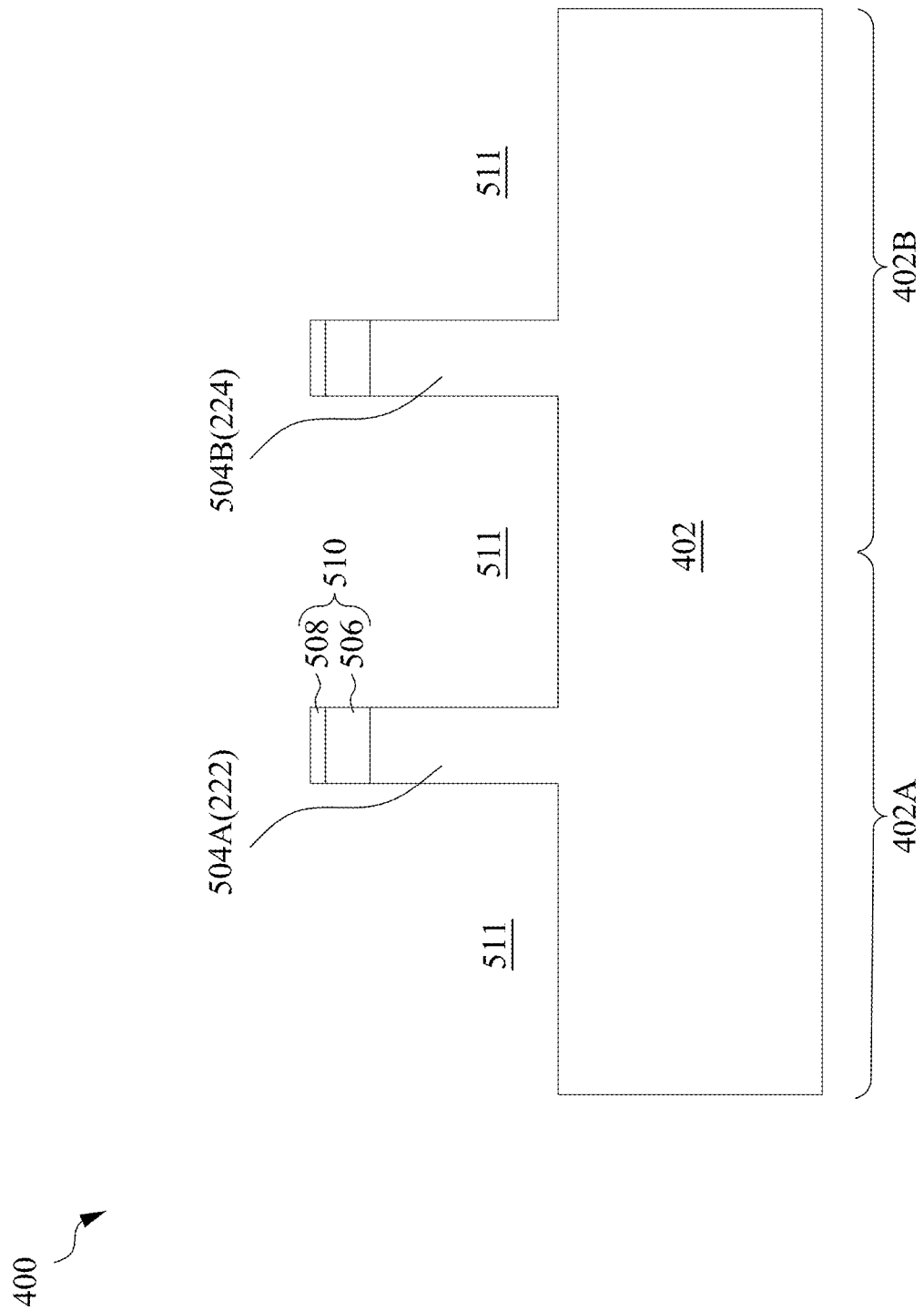

Corresponding to operation 304 of FIG. 3, FIG. 5 is a cross-sectional view of the FinFET device 400 including semiconductor fins 504A and 504B at one of the various stages of fabrication. The view of FIG. 5 is cut along cross-section B-B, as indicated in FIGS. 1 and 2.

The semiconductor fin 504A is formed in the area 402A, and the semiconductor fins 504B is formed in the area 402B. In some embodiments, the semiconductor fins 504A and 504B may be formed according to the active regions 222 and 224 of the layout design 200 shown in FIG. 2, respectively. In some embodiments, the semiconductor fins 504A-B may be each configured as an active fin, which will be adopted as an active (e.g., electrically functional) fin or channel in a completed FinFET. For example, the semiconductor fin 504A may be configured as the active channel of a transistor belonging to the cell 210A (FIG. 2); and the semiconductor fin 504B may be configured as the active channel of a transistor belonging to the cell 210B (FIG. 2).

The semiconductor fins 504A-B are formed by patterning the substrate 402 using, for example, photolithography and etching techniques. For example, a mask layer, such as a pad oxide layer 506 and an overlying pad nitride layer 508, is formed over the substrate 402. The pad oxide layer 506 may be a thin film comprising silicon oxide formed, for example, using a thermal oxidation process. The pad oxide layer 506 may act as an adhesion layer between the substrate 402 and the overlying pad nitride layer 508. In some embodiments, the pad nitride layer 508 is formed of silicon nitride, silicon oxynitride, silicon carbonitride, the like, or combinations thereof. The pad nitride layer 508 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 506 and pad nitride layer 508 to form a patterned mask 510, as illustrated in FIG. 5.

The patterned mask 510 is subsequently used to pattern exposed portions of the substrate 402 to form trenches (or openings) 511, thereby defining the semiconductor fins 504A-B between adjacent trenches 511 as illustrated in FIG. 5. When multiple fins are formed, such a trench may be disposed between any adjacent ones of the fins. In some embodiments, the semiconductor fins 504A-B are formed by etching trenches in the substrate 402 using, for example, reactive ion etch (RIE), neutral beam etch (NBE), the like, or combinations thereof. The etch may be anisotropic. In some embodiments, the trenches 511 may be strips (viewed from the top) parallel to each other, and closely spaced with respect to each other. In some embodiments, the trenches 511 may be continuous and surround the semiconductor fins 504A-B.

The semiconductor fins 504A-B may be patterned by any suitable method. For example, the semiconductor fins 504A-B may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 4 and 5 illustrate an embodiment of forming the semiconductor fins 504A-B, but a fin may be formed in various different processes. For example, a top portion of the substrate 402 may be replaced by a suitable material, such as an epitaxial material suitable for an intended type (e.g., N-type or P-type) of semiconductor devices to be formed. Thereafter, the substrate 402, with epitaxial material on top, is patterned to form the semiconductor fins 504A-B that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the semiconductor fins 504A-B may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
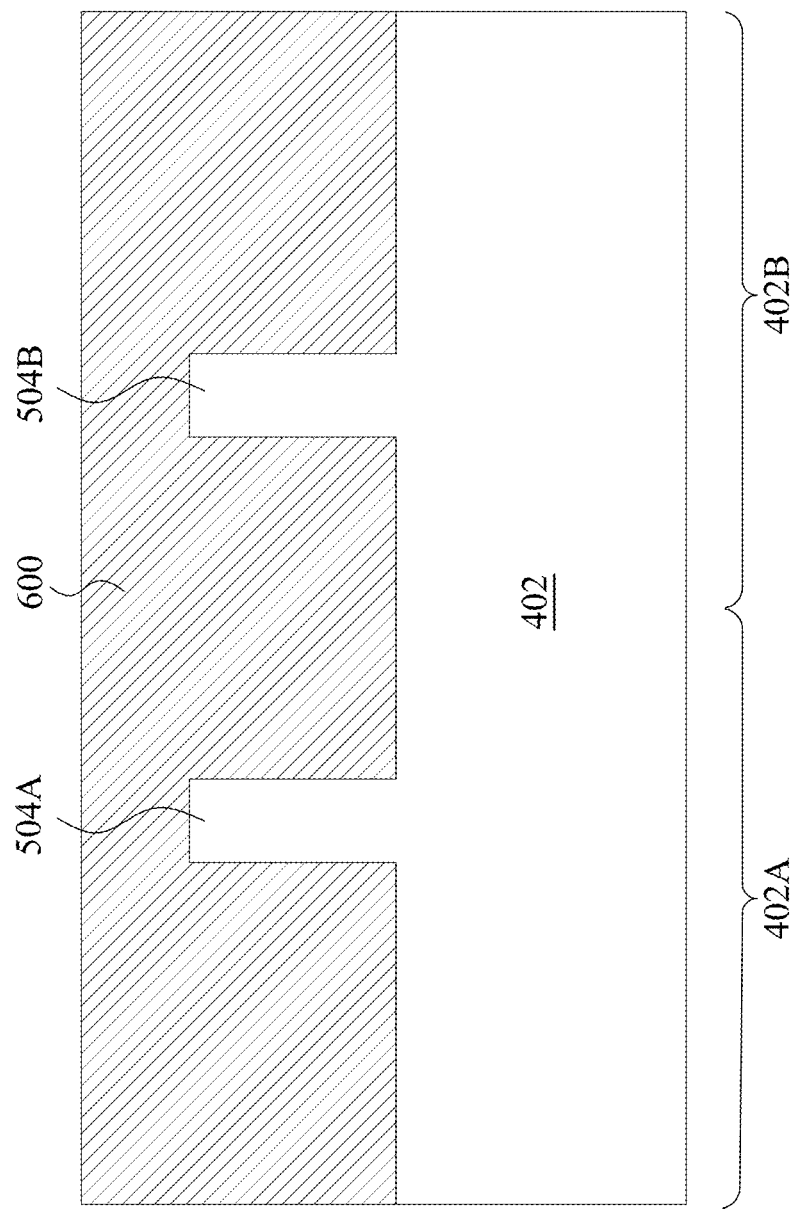
Figure 7:
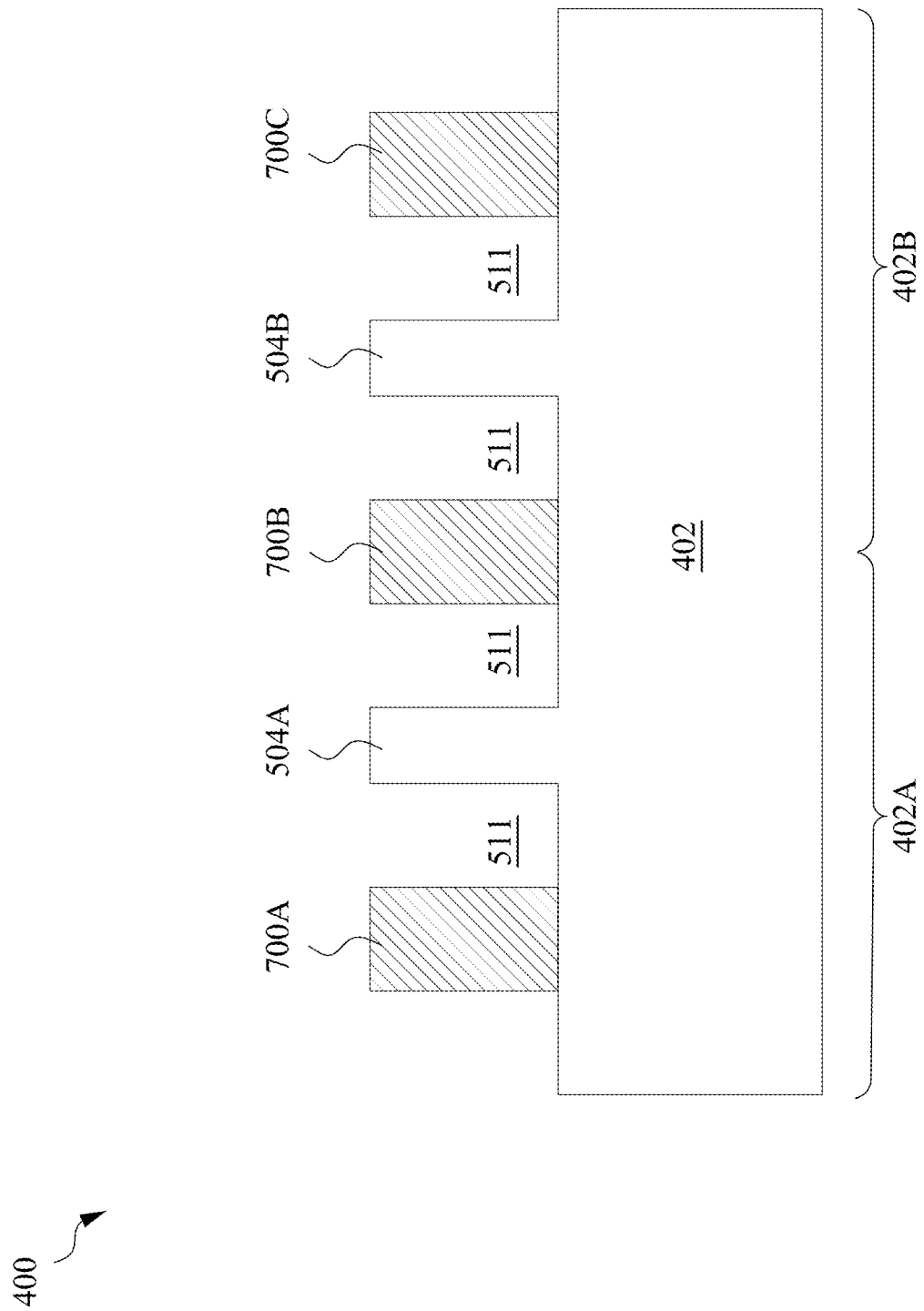

Corresponding to operation 306 of FIG. 3, FIG. 6 is a cross-sectional views of the FinFET device 400 including a dummy channel layer 600 at one of the various stages of fabrication, and FIG. 7 is a cross-sectional views of the FinFET device 400 including dummy fins 700A, 700B, and 700C at one of the various stages of fabrication. The views of FIGS. 6 and 7 are cut along cross-section B-B, as indicated in FIGS. 1 and 2.

In some embodiments, the dummy channel layer 600 can include a dielectric material used to form the dummy fins 700A-C. For example, the dielectric material may include silicon oxide, silicon nitride, silicon oxynitride, silicon carbide, silicon carbonitride, silicon oxycarbonitride, silicon oxycarbide, or combinations thereof. In another example, the dielectric material may include group IV-based oxide or group IV-based nitride, e.g., tantalum nitride, tantalum oxide, hafnium oxide, or combinations thereof. The dummy channel layer 600 may be formed using low-pressure chemical vapor deposition (LPCVD) or plasma enhanced chemical vapor deposition (PECVD), for example.

Upon depositing the dummy channel layer 600 overlaying the semiconductor fins 504A-B, one or more dummy fins, e.g., 700A-C, may be formed between or next to the semiconductor fins 504A-B. For example, the dummy fin 700A may be formed in the area 402A next to the semiconductor fin 504A (or between the semiconductor fin 504A and a non-illustrated fin corresponding to the active region 220 of FIG. 2); the dummy fin 700B may be formed between the semiconductor fins 504A and 504B, which may be at the intersection of the areas 402A and 402B; and the dummy fin 700C may be formed in the area 402B next to the semiconductor fin 504B (or between the semiconductor fin 504B and a non-illustrated fin corresponding to the active region 226 of FIG. 2).

The dummy fins 700A-C are formed by patterning the dummy channel layer 700 using, for example, photolithography and etching techniques. For example, a patterned mask may be formed over the dummy channel layer 600 to mask portions of the dummy channel layer 600 where the dummy fins 700A-C are to be formed. Subsequently, unmasked portions of the dummy channel layer 600 may be etched using, for example, reactive ion etch (RIE), neutral beam etch (NBE), the like, or combinations thereof, thereby defining the dummy fins 700A-C between or next to the semiconductor fins 504A-B (or in the trenches 511) as illustrated in FIG. 7. The etch may be anisotropic, in some embodiments. In some other embodiments, the dummy fins 700A-C may be formed concurrently with or subsequently to forming isolation regions (e.g., 800 of FIG. 8), which will be discussed below.

Figure 8:
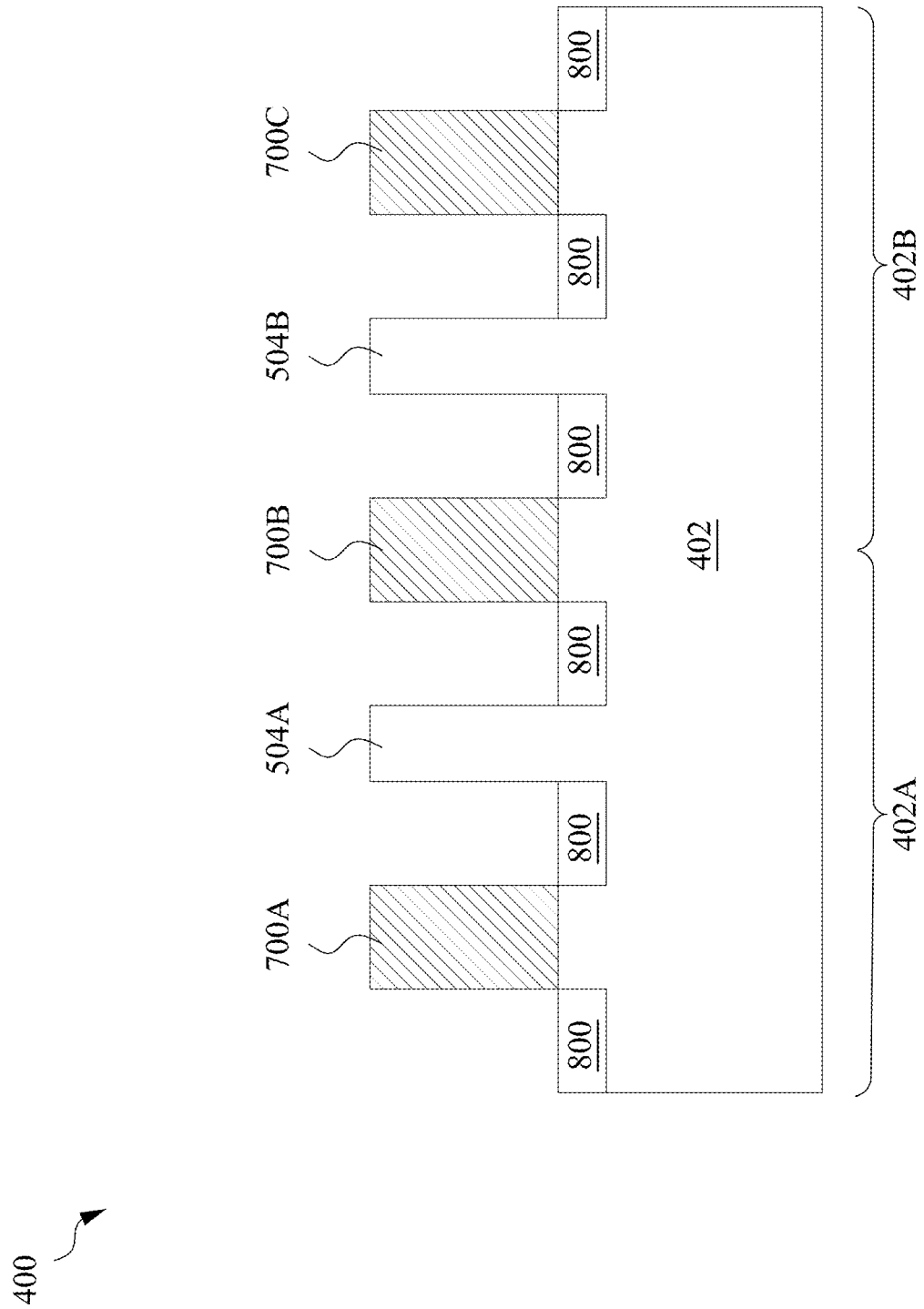

Corresponding to operation 308 of FIG. 3, FIG. 8 is a cross-sectional view of the FinFET device 400 including isolation regions 800 at one of the various stages of fabrication. The view of FIG. 8 is cut along cross-section B-B, as indicated in FIGS. 1 and 2.

The isolation regions 800, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 800 and a top surface of the fins 504A-B and 700A-C that are coplanar (not shown). The patterned mask 510 (FIG. 5) may also be removed by the planarization process.

In some embodiments, the isolation regions 800 include a liner, e.g., a liner oxide (not shown), at the interface between each of the isolation regions 800 and the substrate 402 (semiconductor fins 504A-B). In some embodiments, the liner oxide is formed to reduce crystalline defects at the interface between the substrate 402 and the isolation region 800. Similarly, the liner oxide may also be used to reduce crystalline defects at the interface between the semiconductor fins 504A-B and the isolation region 800. The liner oxide (e.g., silicon oxide) may be a thermal oxide formed through a thermal oxidation of a surface layer of the substrate 402, although other suitable method may also be used to form the liner oxide.

Next, the isolation regions 800 are recessed to form shallow trench isolation (STI) regions 800, as shown in FIG. 8. The isolation regions 800 are recessed such that the upper portions of the fins 504A-B and 700A-C protrude from between neighboring STI regions 800. Respective top surfaces of the STI regions 800 may have a flat surface (as illustrated), a convex surface, a concave surface (such as dishing), or combinations thereof. The top surfaces of the STI regions 800 may be formed flat, convex, and/or concave by an appropriate etch. The isolation regions 800 may be recessed using an acceptable etching process, such as one that is selective to the material of the isolation regions 800. For example, a dry etch or a wet etch using dilute hydrofluoric (DHF) acid may be performed to recess the isolation regions 800.

As mentioned above, the dummy fins 700A-C may be formed concurrently with or subsequently to the formation of the isolation regions 800. For example, when forming the semiconductor fins 504A-B (FIG. 5), one or more other semiconductor fins may also be formed in the trenches 511. The insulation material of the isolation regions 800 may be deposited over the semiconductor fins, followed by a CMP process to planarize the top surfaces of the isolation regions 800 and the semiconductor fins, which include the semiconductor fins 504A-B and the semiconductor fins formed in the trenches 511. Subsequently, an upper portion of the semiconductor fins formed in the trenches 511 may be partially removed to form cavities. The cavities are then filled with the dielectric material of the dummy channel layer 600, followed by another CMP process to form the dummy fins 700A-C. The isolation regions 800 are recessed to form the shallow trench isolation (STI) regions 800. Using such a method to form the dummy fins 700A-C, the dummy fins 700A-B are formed on the substrate 402 and a bottom surface of the dummy fins 700A-B is below the top surface of the isolation regions 800. Depending on how much of the isolation regions 800 is recessed, the bottom surface of the dummy fins 700A-C may be above the top surface of the isolation regions 800, while remaining within the scope of the present disclosure.

Figure 9:
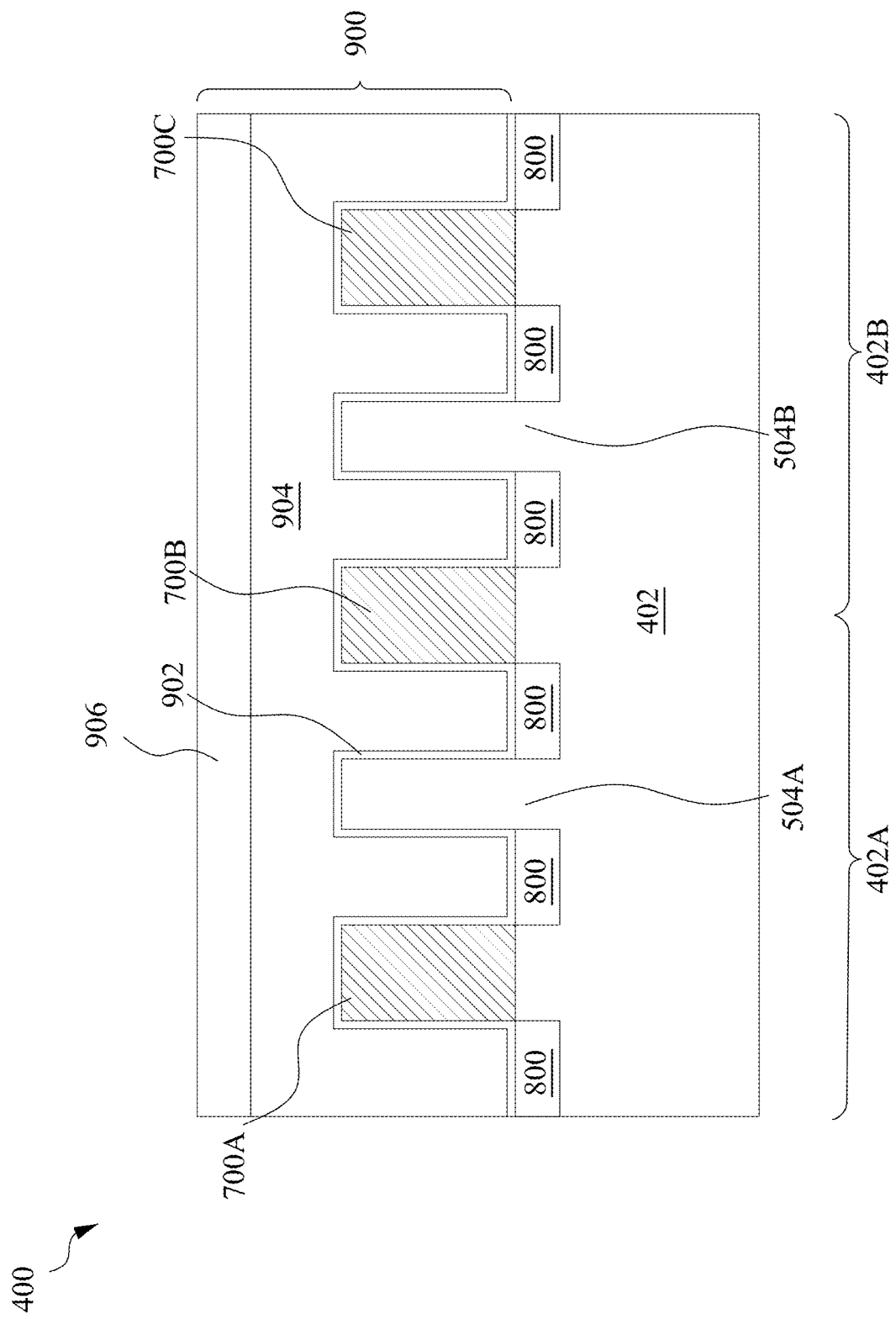

Corresponding to operation 310 of FIG. 3, FIG. 9 is a cross-sectional view of the FinFET device 400 including a dummy gate structure 900 at one of the various stages of fabrication. The view of FIG. 9 is cut along cross-section B-B, as indicated in FIGS. 1 and 2.

The dummy gate structure 900 is formed to overlay (e.g., straddle) a respective portion of each of the fins (e.g., semiconductor fins 504A-B, dummy fins 700A-C) across the areas 402A-B. In some embodiments, the dummy gate structure 900 may be formed according to the gate structure 244 of the layout design 200 shown in FIG. 2. It should be appreciated that the dummy gate structure 900 may be formed according to any of the other gate structures of the layout design 200 while remaining within the scope of the present disclosure.

The dummy gate structure 900 includes a dummy gate dielectric 902 and a dummy gate 904, in some embodiments. A mask 906 may be formed over the dummy gate structure 900. To form the dummy gate structure 900, a dielectric layer is formed on the semiconductor fins 504A-B and dummy fins 700A-C. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques to form the mask 906. The pattern of the mask 906 then may be transferred to the gate layer and the dielectric layer by a suitable etching technique to form the dummy gate 904 and the underlying dummy gate dielectric 902, respectively. The dummy gate 904 and the dummy gate dielectric 902 cover a respective central portion (e.g., a channel region) of each of the semiconductor fins 504A-B and the dummy fins 700A-C. The dummy gate 904 may have a lengthwise direction (e.g., cross-section B-B as indicated in FIGS. 1 and 2) substantially perpendicular to the lengthwise direction (e.g., cross-section A-A as indicated in FIGS. 1 and 2) of the fins.

The dummy gate dielectric 902 is shown to be formed over the semiconductor fins 504A-B and the dummy fins 700A-C (e.g., over the respective top surfaces and the sidewalls of the fins) and over the STI regions 800 in the example of FIG. 9. In other embodiments, the dummy gate dielectric 902 may be formed by, e.g., thermal oxidization of a material of the fins, and therefore, may be formed over the fins but not over the STI regions 800. It should be appreciated that these and other variations are still included within the scope of the present disclosure.

In FIGS. 10, 11A, 12A, and 13A, four dummy gate structures 900-1, 900-2, 900-3, and 900-4, which respectively correspond to the gate structures 240, 242, 244, and 246 of the layout design 200 in FIG. 2, are illustrated over one of the semiconductor fins. The semiconductor fin 504A, which corresponds to the active region 222 of the layout design 200 in FIG. 2, will be illustrated in the following figures as a representative example. Accordingly, cross-section A-A as indicted in FIGS. 1-2 corresponds to cross-section cut along a longitudinal (or lengthwise) direction of the semiconductor fin 504A; cross-section B-B as indicated in FIGS. 1-2 corresponds to cross-section cut along a longitudinal (or lengthwise) direction of the dummy gate structure 900-3; and cross-section C-C as indicated in FIG. 1-2 corresponds to cross-section cut along a direction that is parallel to the longitudinal direction and between the dummy gate structures 900-3 and 900-4. For simplicity, the dummy gate structures 900-1 to 900-4 may sometimes be collectively referred to as dummy gate structures 900. It should be appreciated that more or less than four dummy gate structures can be formed over the fin 504A (and each of the other fins, e.g., 504B, 700A-C), while remaining within the scope of the present disclosure.

Figure 10:
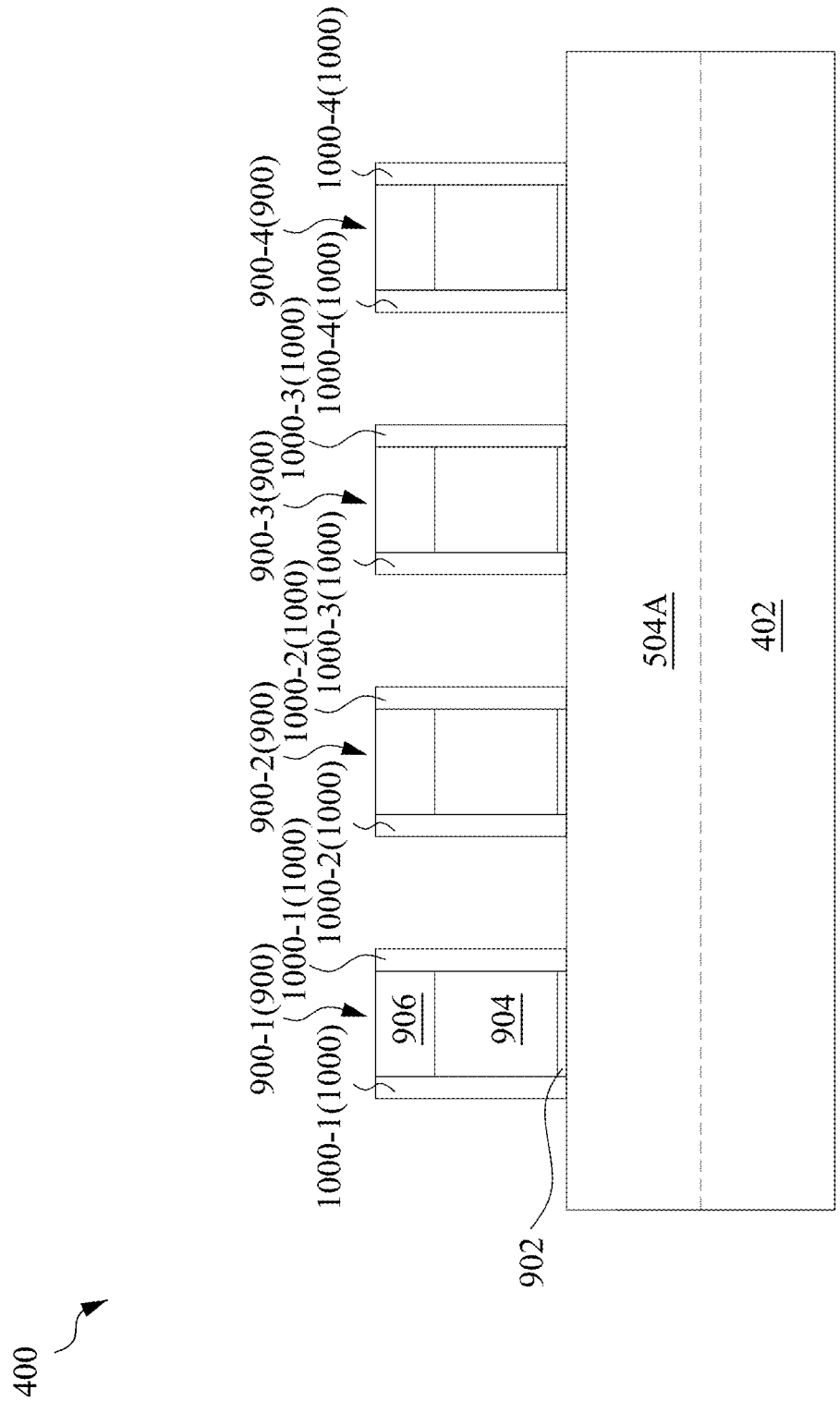

Corresponding to operation 312 of FIG. 3, FIG. 10 is a cross-sectional view of the FinFET device 400 including gate spacers 1000-1, 1000-2, 1000-3, and 1000-4 formed around (e.g., along and contacting the sidewalls of) the dummy gate structures 900, respectively, at one of the various stages of fabrication. The view of FIG. 10 is cut along cross-section A-A, as indicated in FIGS. 1 and 2. For simplicity, the gate spacers 1000-1 to 1000-4 may sometimes be collectively referred to as gate spacers 1000.

As shown in FIG. 10, the gate spacer 1000-1 is formed on opposing sidewalls of the dummy gate structure 900-1; the gate spacer 1000-2 is formed on opposing sidewalls of the dummy gate structure 900-2; the gate spacer 1000-3 is formed on opposing sidewalls of the dummy gate structure 900-3; and the gate spacer 1000-4 is formed on opposing sidewalls of the dummy gate structure 900-4. It should be understood that any number of gate spacers can be formed around each of the dummy gate structures 900 while remaining within the scope of the present disclosure. For example, two or more gate spacers, formed as a multi-layer stack, may be formed on opposing sidewalls of each of the dummy gate structures.

The gate spacers 1000 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacers 1000. The shapes and formation methods of the gate spacers 1000 as illustrated in FIG. 10 are merely non-limiting examples, and other shapes and formation methods are possible. These and other variations are fully intended to be included within the scope of the present disclosure.

Figure 11A:
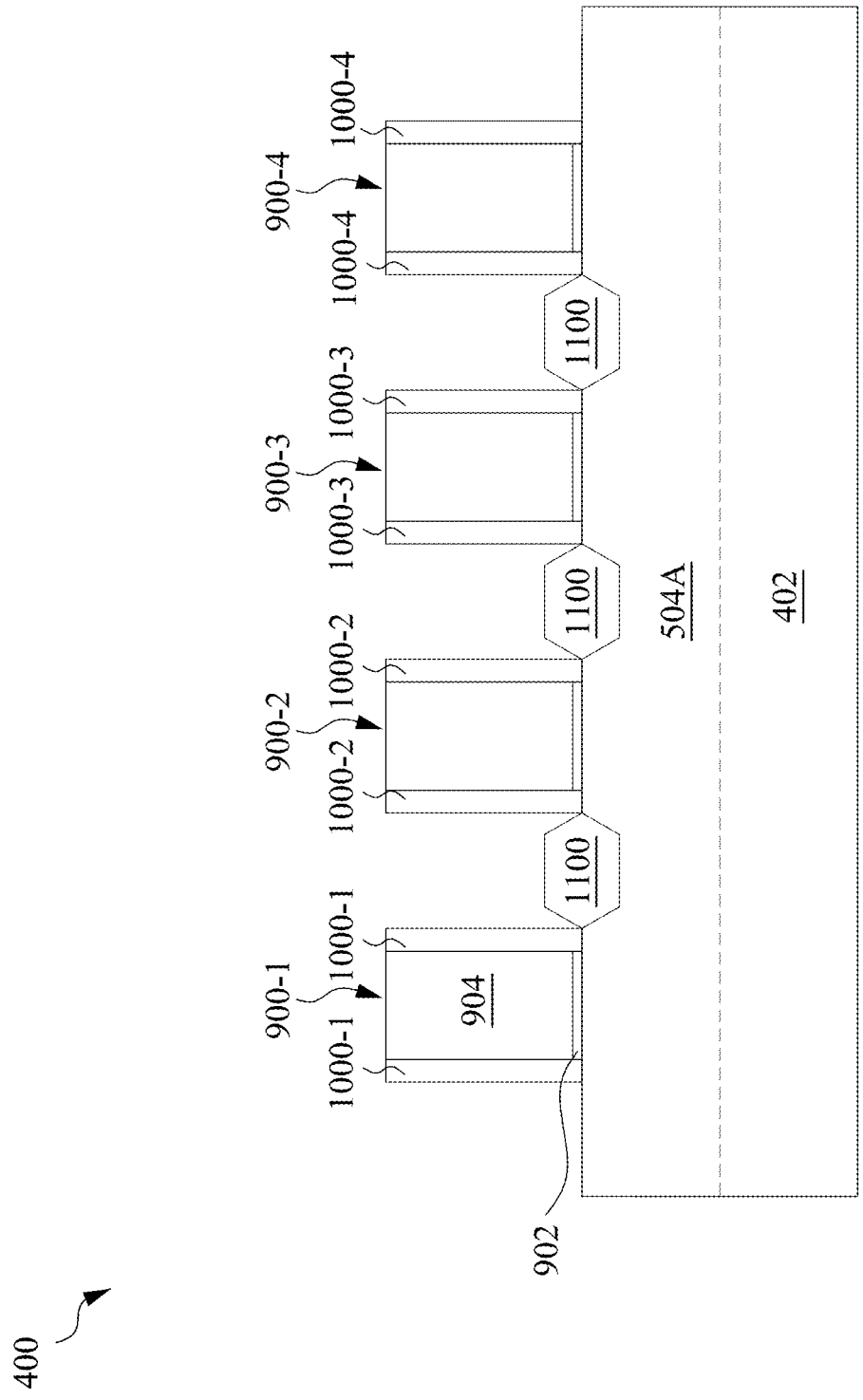
Figure 11B:
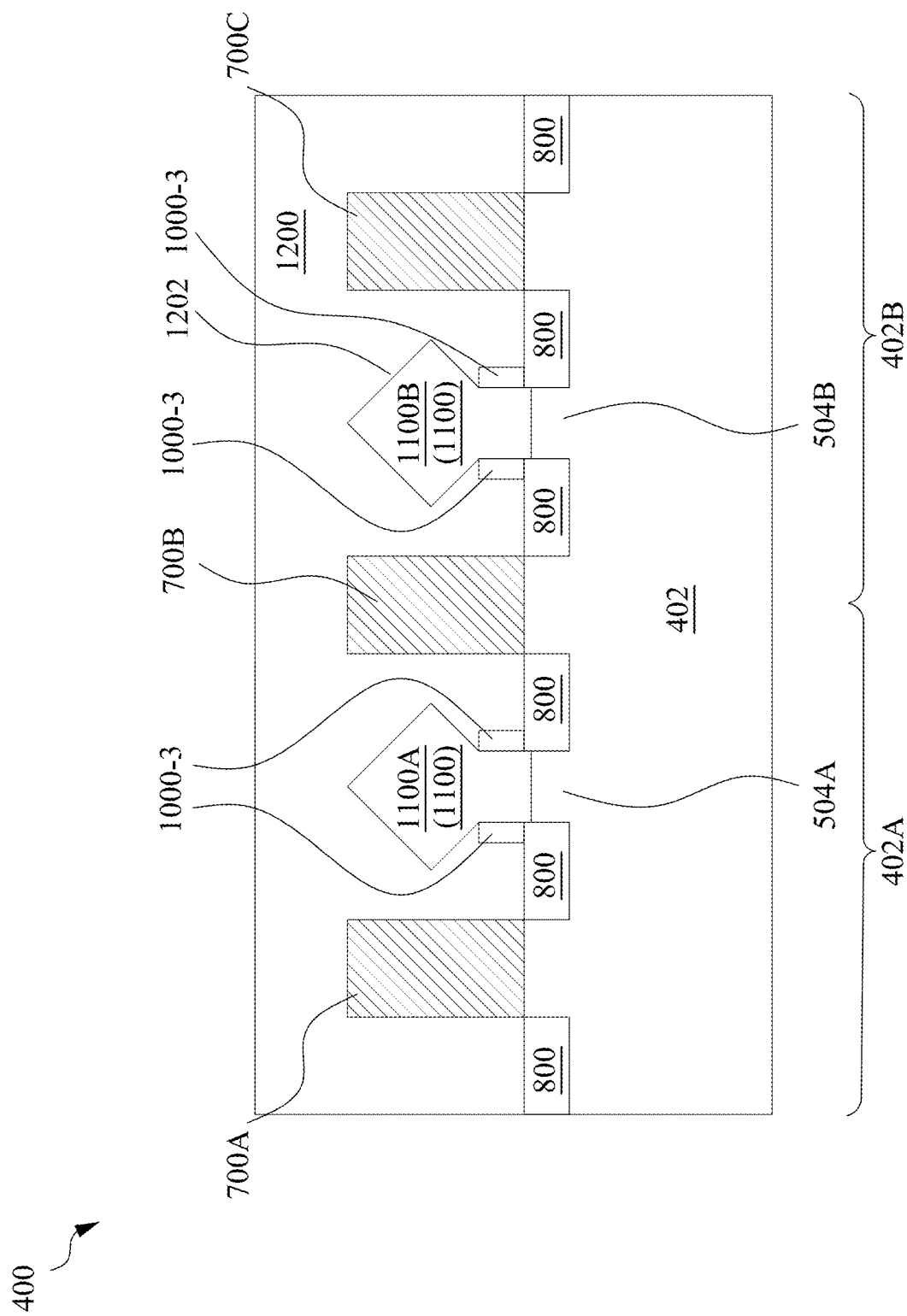

Corresponding to operation 314 of FIG. 3, FIG. 11A is a cross-sectional view of the FinFET device 400 including a number of source/drain regions 1100 at one of the various stages of fabrication. The view of FIG. 11A is cut along cross-section A-A, as indicated in FIGS. 1 and 2. Corresponding to the same operation 314, FIG. 11B is another cross-sectional view of the FinFET device 400 cut along cross-section C-C, as indicated in FIGS. 1 and 2.

In some embodiments, the source/drain regions 1100 are formed in recesses of the semiconductor fin 504A adjacent to the dummy gate structures 900, e.g., between adjacent dummy gate structures 900 and/or next to a dummy gate structure 900. The recesses are formed by, e.g., an anisotropic etching process using the dummy gate structures 900 as an etching mask, in some embodiments, although any other suitable etching process may also be used.

The source/drain regions 1100 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 11A, the epitaxial source/drain regions 1100 may have surfaces raised from respective surfaces of the semiconductor fin 504A (e.g. raised above the non-recessed portions of the semiconductor fin 504A) and may have facets. In some embodiments, the source/drain regions 1100 of the adjacent fins may not merge together and remain separated apart from each other. For example, as shown in FIG. 11B, the source/drain region 1100 formed in (or extended from) the semiconductor fin 504A and the source/drain region 1100 formed in (or extended from) the semiconductor fin 504B, which are sometimes referred to as source/drain regions 1100A and 1100B, respectively, do not merge together. Further, the source/drain regions 1100A and 1100B are separated apart from each other by the dummy fin 700B. According to various embodiments, such a dummy fin 700B may be removed to form an air void to reduce the cross-coupling between the source/drain regions 1100A and 1100B, which will be discussed in further detail below.

In some embodiments, when the resulting FinFET device is an n-type FinFET, the source/drain regions 1100 can include silicon carbide (SiC), silicon phosphorous (SiP), phosphorous-doped silicon carbon (SiCP), or the like. In some embodiments, when the resulting FinFET device is a p-type FinFET, the source/drain regions 1100 comprise SiGe, and a p-type impurity such as boron or indium.

The epitaxial source/drain regions 1100 may be implanted with dopants to form source/drain regions 1100 followed by an annealing process. The implanting process may include forming and patterning masks such as a photoresist to cover the regions of the FinFET device 400 that are to be protected from the implanting process. The source/drain regions 1100 may have an impurity (e.g., dopant) concentration in a range from about $1 \times 10^{19}$ cm$^{-3}$ to about $1 \times 10^{21}$ cm$^{-3}$. P-type impurities, such as boron or indium, may be implanted in the source/drain regions 1100 of a P-type transistor. N-type impurities, such as phosphorous or arsenide, may be implanted in the source/drain regions 1100 of an N-type transistor. In some embodiments, the epitaxial source/drain regions 1100 may be in situ doped during their growth.

Figure 12A:
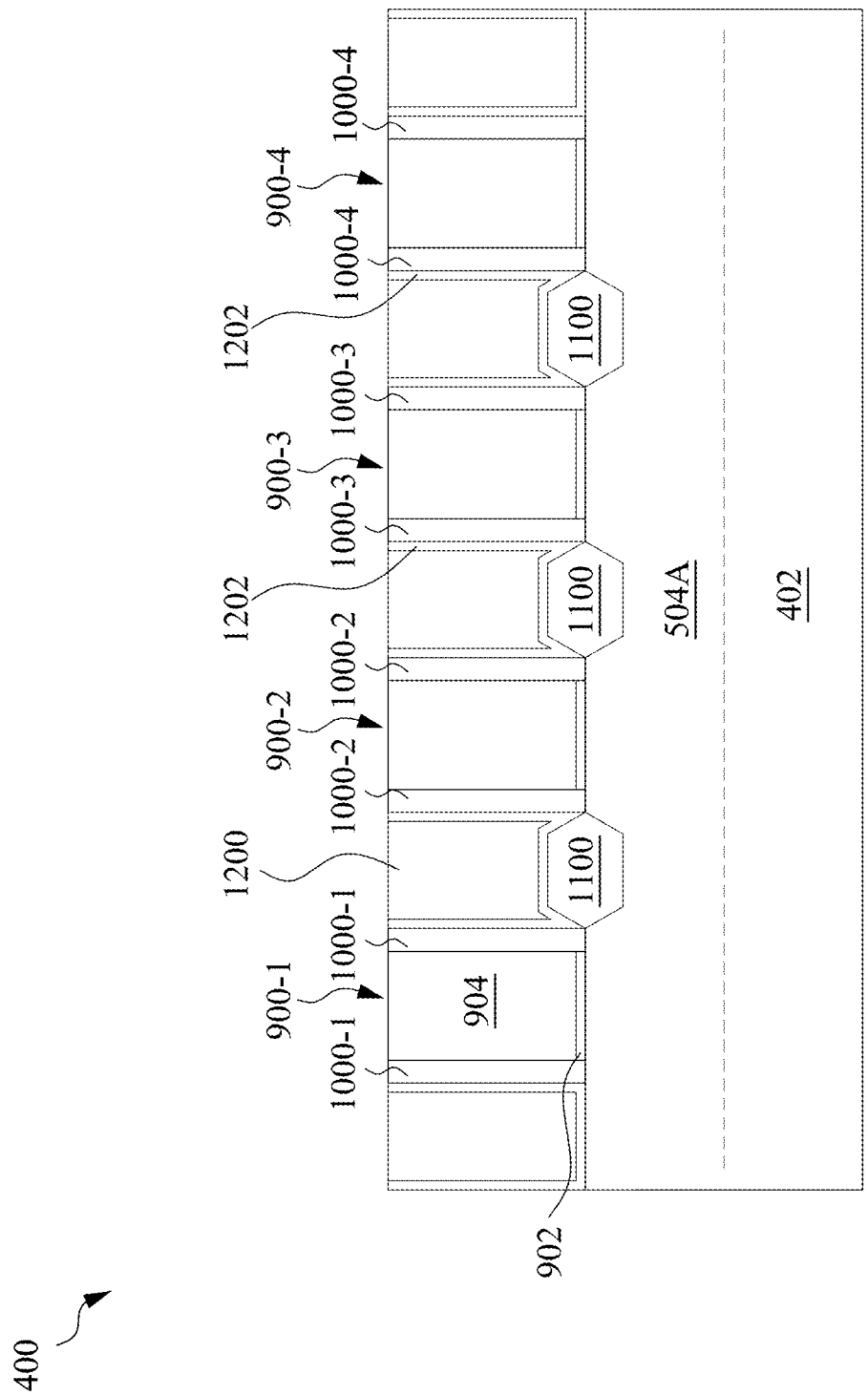

Corresponding to operation 316 of FIG. 3, FIG. 12A is a cross-sectional view of the FinFET device 400 including an interlayer dielectric (ILD) 1200 at one of the various stages of fabrication. The view of FIG. 12A is cut along cross-section A-A, as indicated in FIGS. 1 and 2. Corresponding to the same operation 316, FIG. 12B is another cross-sectional view of the FinFET device 400 cut along cross-section C-C, as indicated in FIGS. 1 and 2.

Figure 12B:
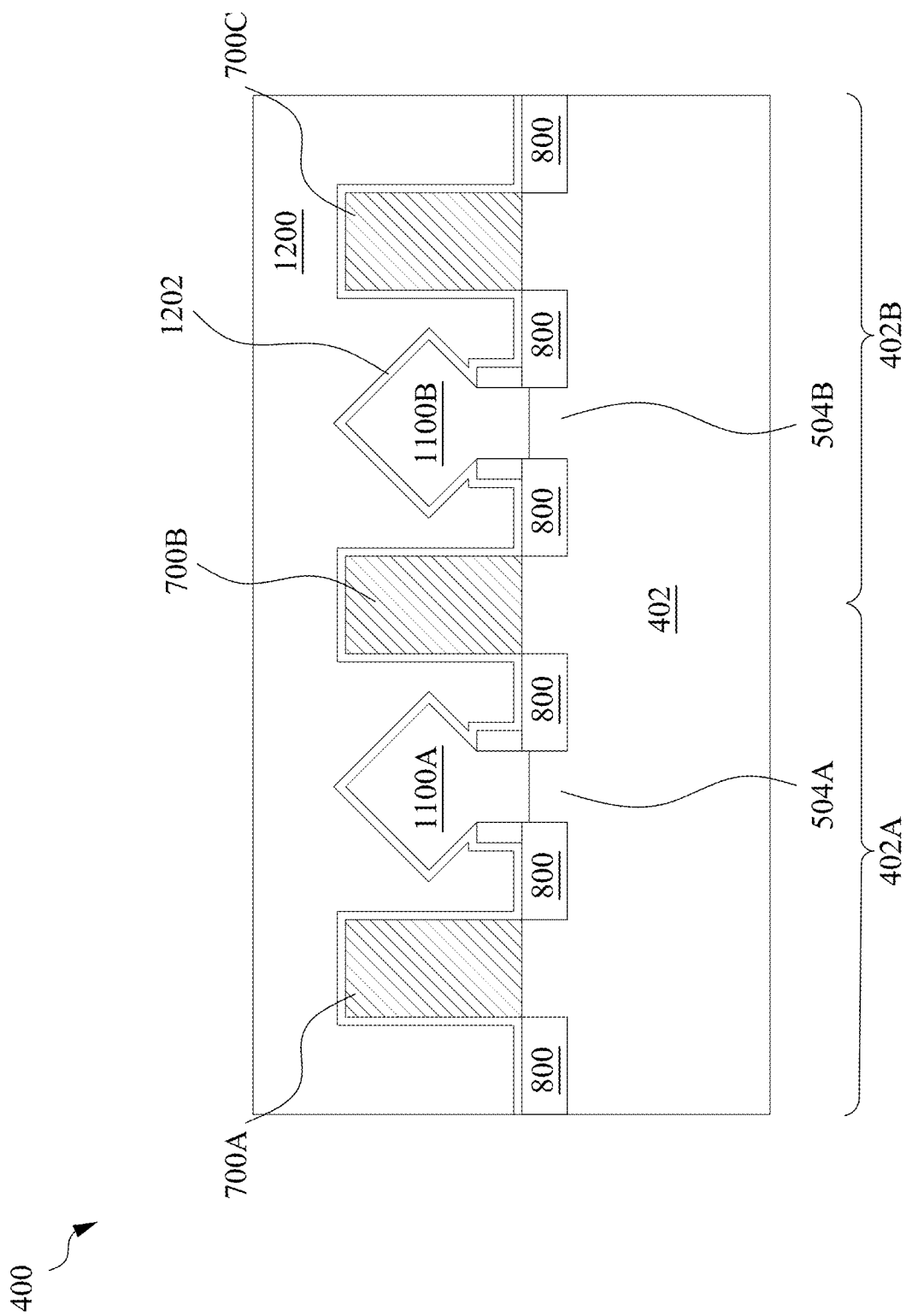

In some embodiments, prior to forming the ILD 1200, a contact etch stop layer (CESL) 1202 is formed over the structure, as illustrated in FIGS. 12A-B. The CESL 1202 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 1200 is formed over the CESL 1202 and over the dummy gate structures 900. In some embodiments, the ILD 1200 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 1200 is formed, an optional dielectric layer is formed over the ILD 1200. The dielectric layer can function as a protection layer to prevent or reduces the loss of the ILD 1200 in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level upper surface for the dielectric layer or the ILD 1200. The CMP may also remove the mask 906 and portions of the CESL 1202 disposed over the dummy gate 904 (FIG. 11A). After the planarization process, the upper surface of the dielectric layer or the ILD 1200 is level with the upper surface of the dummy gate 904, as shown in FIG. 12A; and the ILD 1200 (together with the CESL 1202) are disposed between any of adjacent features/structures, e.g., between the dummy fin 700A and the source/drain region 1100A, between the source/drain region 1100A and the dummy fin 700B, between the dummy fin 700B and the source/drain region 1100B, etc., as shown in FIG. 12B.

Figure 13A:
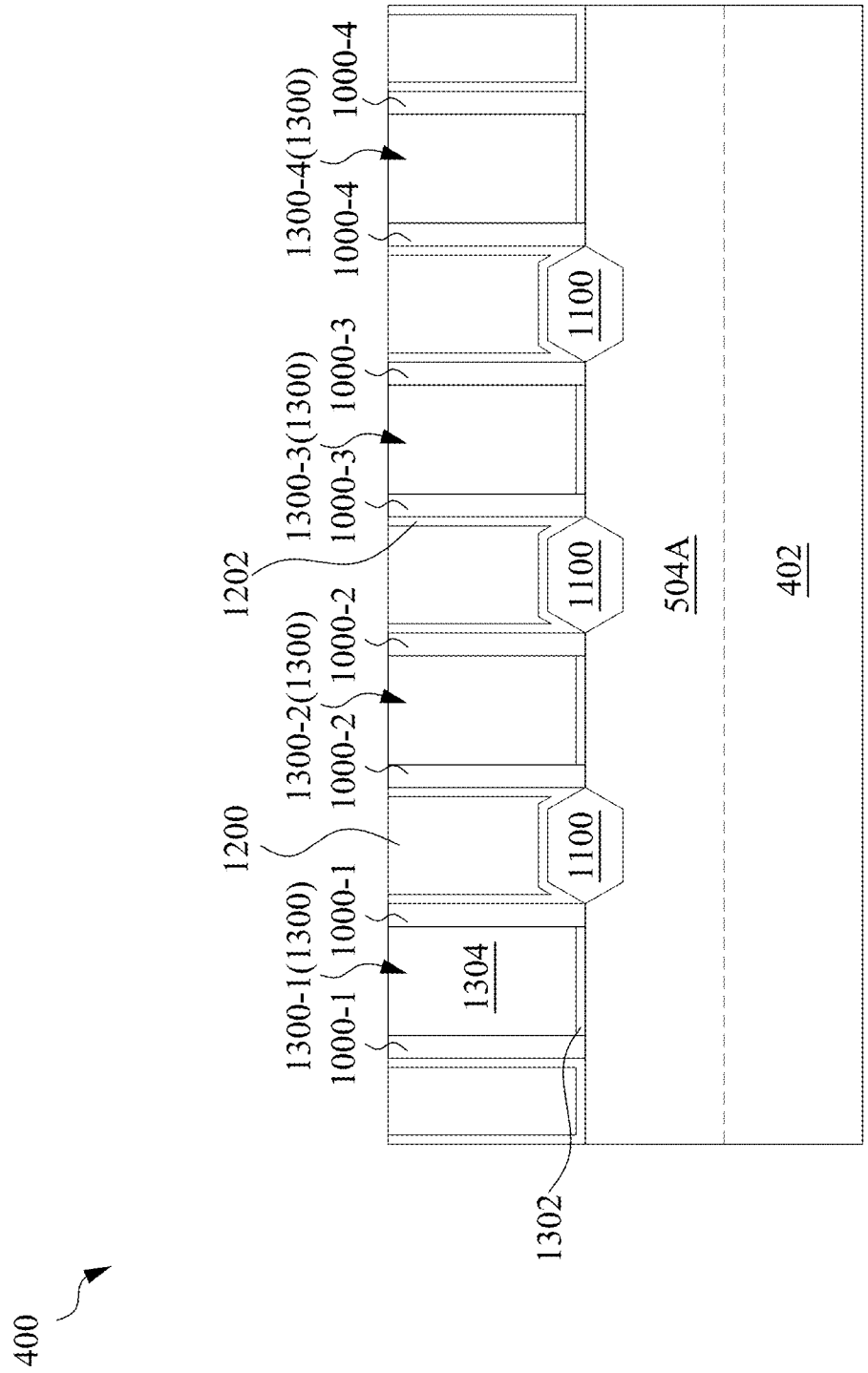
Figure 13B:
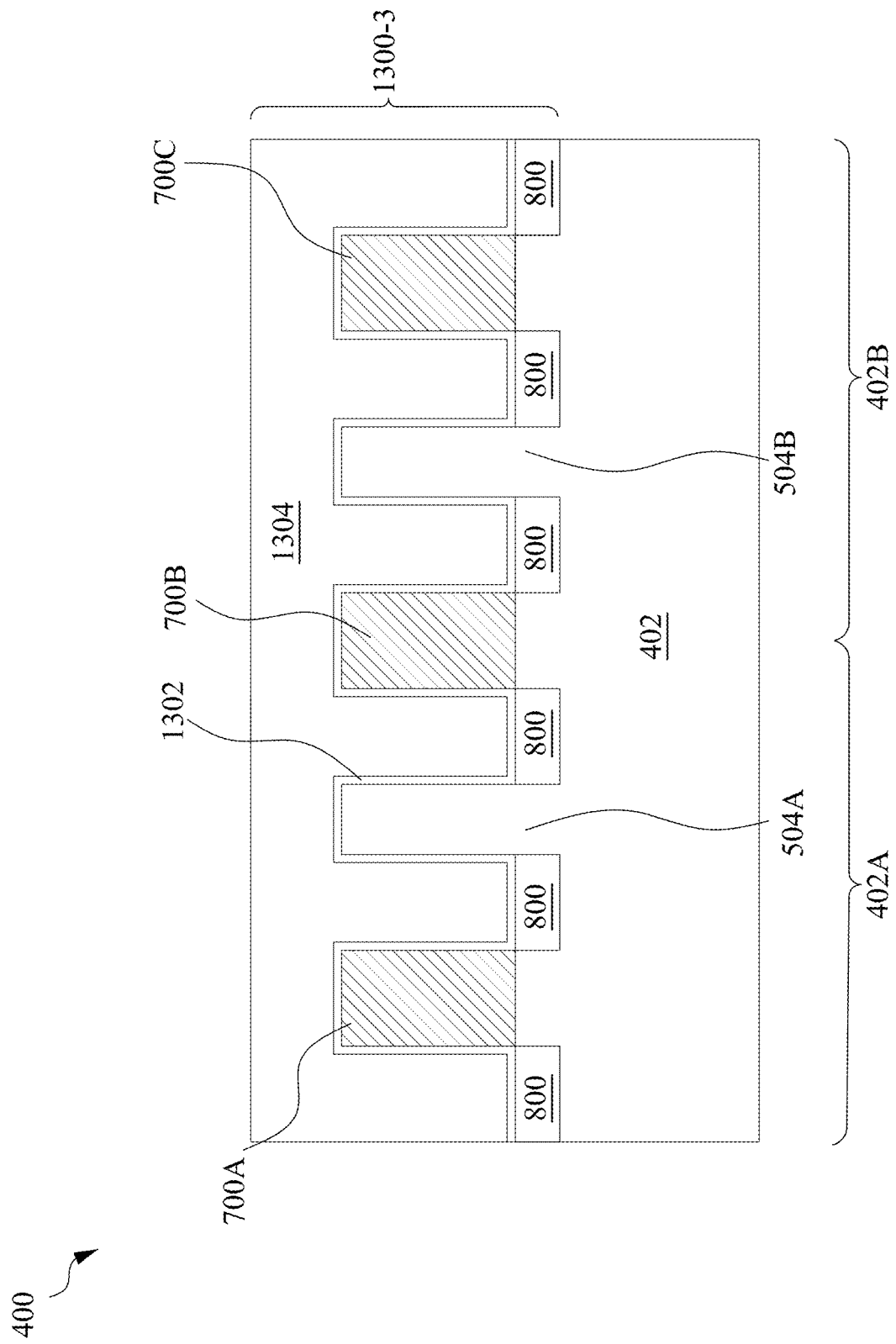

Corresponding to operation 318 of FIG. 3, FIG. 13A is a cross-sectional view of the FinFET device 400 in which the dummy gate structures 900-1, 900-2, 900-3, and 900-4 are replaced with active gate structures 1300-1, 1300-2, 1300-3, and 1300-4, respectively, at one of the various stages of fabrication. The view of FIG. 13A is cut along cross-section A-A, as indicated in FIGS. 1 and 2. Corresponding to the same operation 318, FIG. 13B is another cross-sectional view of the FinFET device 400 cut along cross-section B-B, as indicated in FIGS. 1 and 2. For simplicity, the active gate structures 1300-1 to 1300-4 may sometimes be collectively referred to as active gate structures 1300. It should be appreciated that more or less than four active gate structures can be formed over the fin 504A (and each of the other fins, e.g., 504B, 700A-C), while remaining within the scope of the present disclosure.

The active gate structures 1300 can each include a gate dielectric layer 1302, a metal gate layer 1304, and one or more other layers that are not shown for clarity. For example, each of the active gate structures 1300 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

Prior to forming the active gate structures 1300, the dummy gate structures 900 are removed to form respective gate trenches, each of which is surrounded by the corresponding gate spacer. For example, a gate trench, surrounded by the gate spacer 1000-1, can be formed by removing the dummy gate structure 900-1 (FIG. 12A). The gate dielectric layer 1302 is deposited (e.g., conformally) in a corresponding gate trench to surround (e.g., straddle) the fins, e.g., semiconductor fins 504A-B and dummy fins 700A-C, as illustrated in FIG. 13B. The gate dielectric layer 1302 can overlay the top surfaces and the sidewalls of the dummy fin 700A, the top surfaces and the sidewalls of the semiconductor fin 504A, the top surfaces and the sidewalls of the dummy fin 700B, the top surfaces and the sidewalls of the semiconductor fin 504B, and one of the sidewalls of the dummy fin 700C.

The gate dielectric layer 1302 includes silicon oxide, silicon nitride, or multilayers thereof. In example embodiments, the gate dielectric layer 1302 includes a high-k dielectric material, and in these embodiments, the gate dielectric layers 1302 may have a k value greater than about 7.0, and may include a metal oxide or a silicate of Hf, Al, Zr, La, Mg, Ba, Ti, Pb, and combinations thereof. The formation methods of gate dielectric layer 1302 may include molecular beam deposition (MBD), atomic layer deposition (ALD), PECVD, and the like. A thickness of the gate dielectric layer 1302 may be between about 8 angstroms (Å) and about 20 angstroms, as an example.

The metal gate layer 1304 is formed over the gate dielectric layer 1302. The metal gate layer 1304 may be a P-type work function layer, an N-type work function layer, multi-layers thereof, or combinations thereof, in some embodiments. Accordingly, the metal gate layer 1304 is sometimes referred to as a work function layer. For example, the metal gate layer 1304 may be an N-type work function layer. In the discussion herein, a work function layer may also be referred to as a work function metal. Example P-type work function metals that may be included in the gate structures for P-type devices include TIN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

Figure 14A:
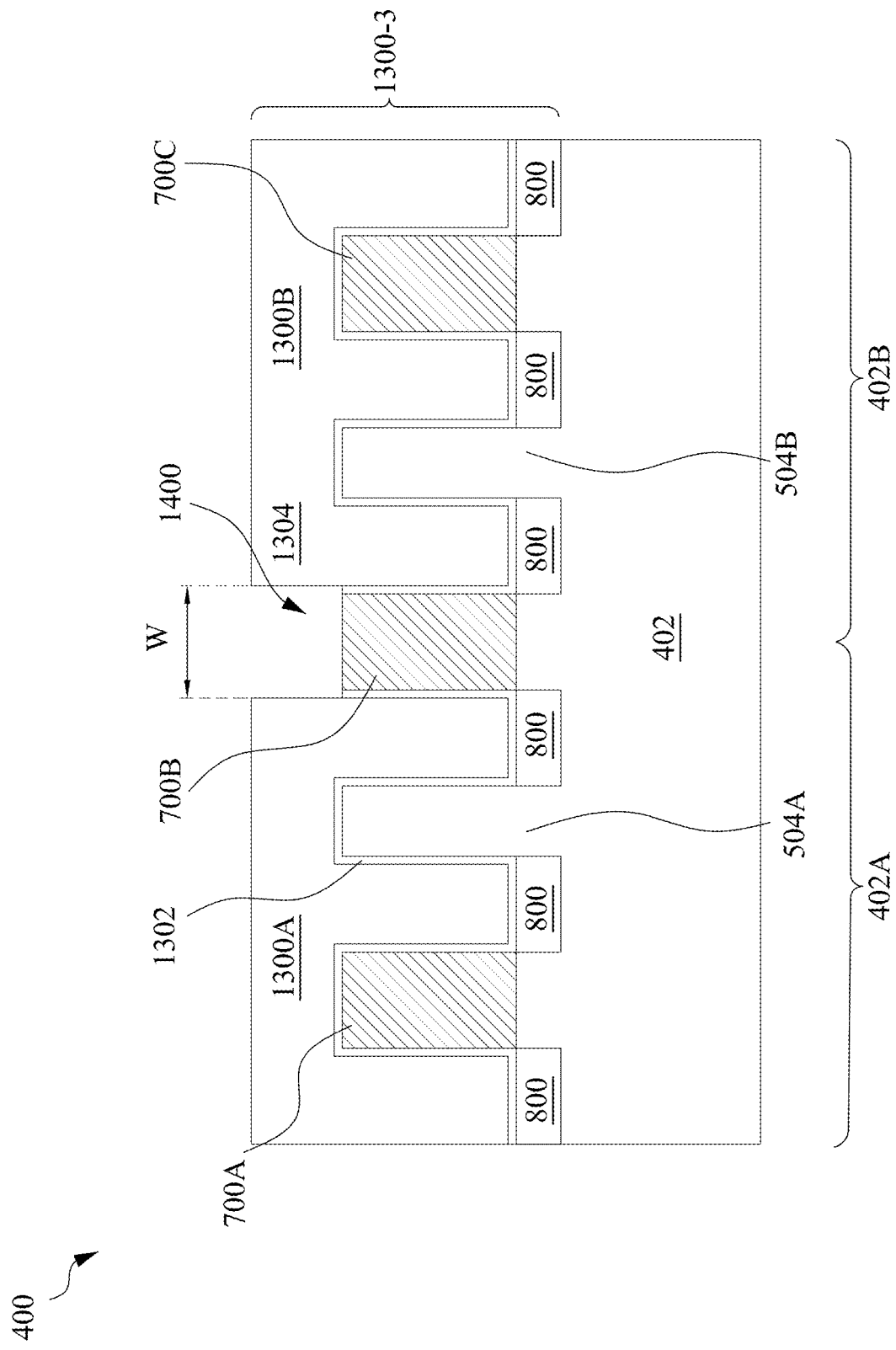

Corresponding to operation 320 of FIG. 3, FIG. 14A is a cross-sectional view of the FinFET device 400 in which the active gate structures 1300 are cut, intercepted, or otherwise disconnected to form a trench (or cavity) 1400 at one of the various stages of fabrication. The view of FIG. 14A is cut along cross-section B-B, as indicated in FIGS. 1 and 2. Corresponding to the same operation 320, FIG. 14B is another cross-sectional view of the FinFET device 400 cut along cross-section C-C, as indicated in FIGS. 1 and 2.

Figure 14B:
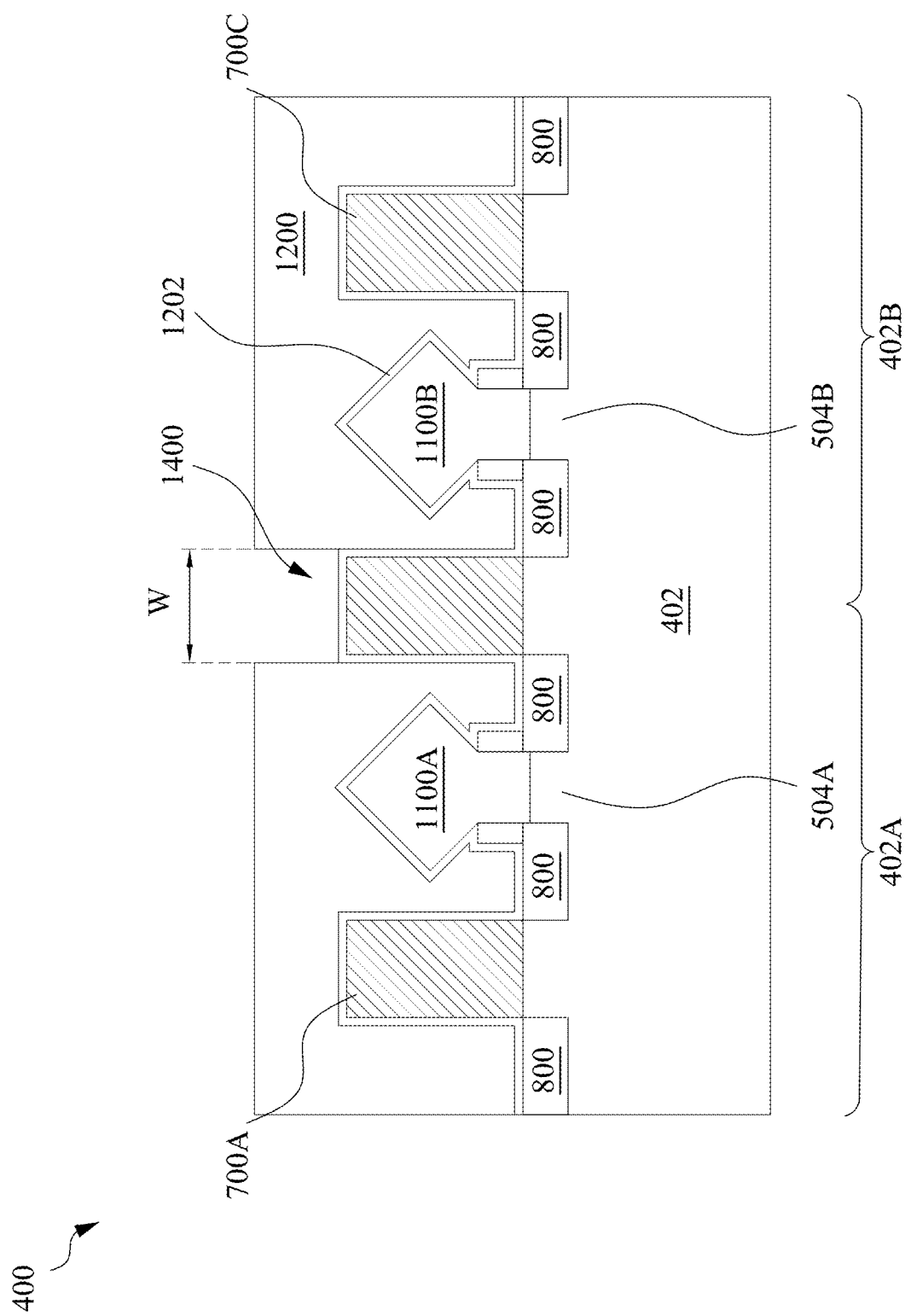

The trench 1400 is formed by removing portions of the metal gate layers 1304 and portions of the gate dielectric layers 1302 disposed above the dummy fin 700B (as shown in FIG. 14A) and portions of the ILD 1200 and portions of the CESL 1202 disposed above the dummy fin 700B (as shown in FIG. 14B). For example, the portions of the metal gate layer 1304 and gate dielectric layer 1302 of each of the active gate structures 1300-1 to 1300-4 overlaying the top surface of the dummy fin 700B and the portions of the ILD 1200 and CESL 1202 overlaying the top surface of the dummy fin 700B are removed, respectively, to form the trench 1400. It is noted that, in addition to vertically overlaying the dummy fin 700B, the removed portions of the ILD 1200 and CESL 1202 are also laterally disposed between adjacent ones of the active gate structures 1300-1 to 1300-4.

As such, upon the trench 1400 being formed, the top surface of the dummy fin 700B, which extends across the active gate structures 1300-1 to 1300-4, can be exposed. Since the dummy fin 700B is disposed between the areas 402A and 402B, upon the trench 1400 being formed, each of the active gate structures 1300-1 to 1300-4 is cut into two separate (isolated) active gate structures. One of the two active gate structures is disposed in the area 402A (e.g., belongs to the top cell 210A as shown in FIG. 2), and the other of the two active gate structures is disposed in the area 402B (e.g., belongs to the top cell 210B as shown in FIG. 2). Using FIG. 14A as a representative example, the active gate structure 1300-3 is cut into two active gate structures 1300A and 1300B, which can correspond to the gate structures 244A and 244B of the layout design 200, respectively, as shown in FIG. 2. Each of the other active gate structures (e.g., 1300-1, 1300-2, 1300-4) is similarly cut into two portions during operation 320.

As discussed above with respect to FIG. 2, the trench 1400 may be formed to have the width (along the longitudinal direction of the active gate structures 1300), W, which can range from one times a critical dimension (CD) of the active gate structures 1300 to about 3 times the CD. In some embodiments, the CD of the active gate structures 1300 is a lateral width of each of the active gate structures 1300 extending between the corresponding spacer. Referring again to FIG. 13A, for example, the active gate structure 1300-3 has a CD extending between the gate spacer 1000-3. In some embodiments, the active gate structures 1300 may share a common CD. However, the active gate structures 1300 may have respective different CDs while remaining within the scope of the present disclosure.

In some embodiments, the trench 1400 may be formed by performing one or more patterning process, followed by one or more etching processes. For example, a patterned mask can be formed over the active gate structures 1300 and the ILD 1200, which are leveled with each other by a CMP. The patterned mask can have a pattern exposing an area of the to-be formed trench 1400, for example, disposed between the areas 402A-B and extends across the active gate structures 1300. Next, at least one anisotropic etching process (e.g., reactive ion etch (RIE), neutral beam etch (NBE), the like, or combinations thereof) may be performed to remove the exposed portions of the active gate structures 1300 and ILD 1200, followed by at least one isotropic etching process to remove residues. While removing the ILD 1200, the anisotropic etching process may be stopped (or end-pointed)

at the underlying CESL 1202, which is subsequently removed by the isotropic etching process.

Figure 15A:
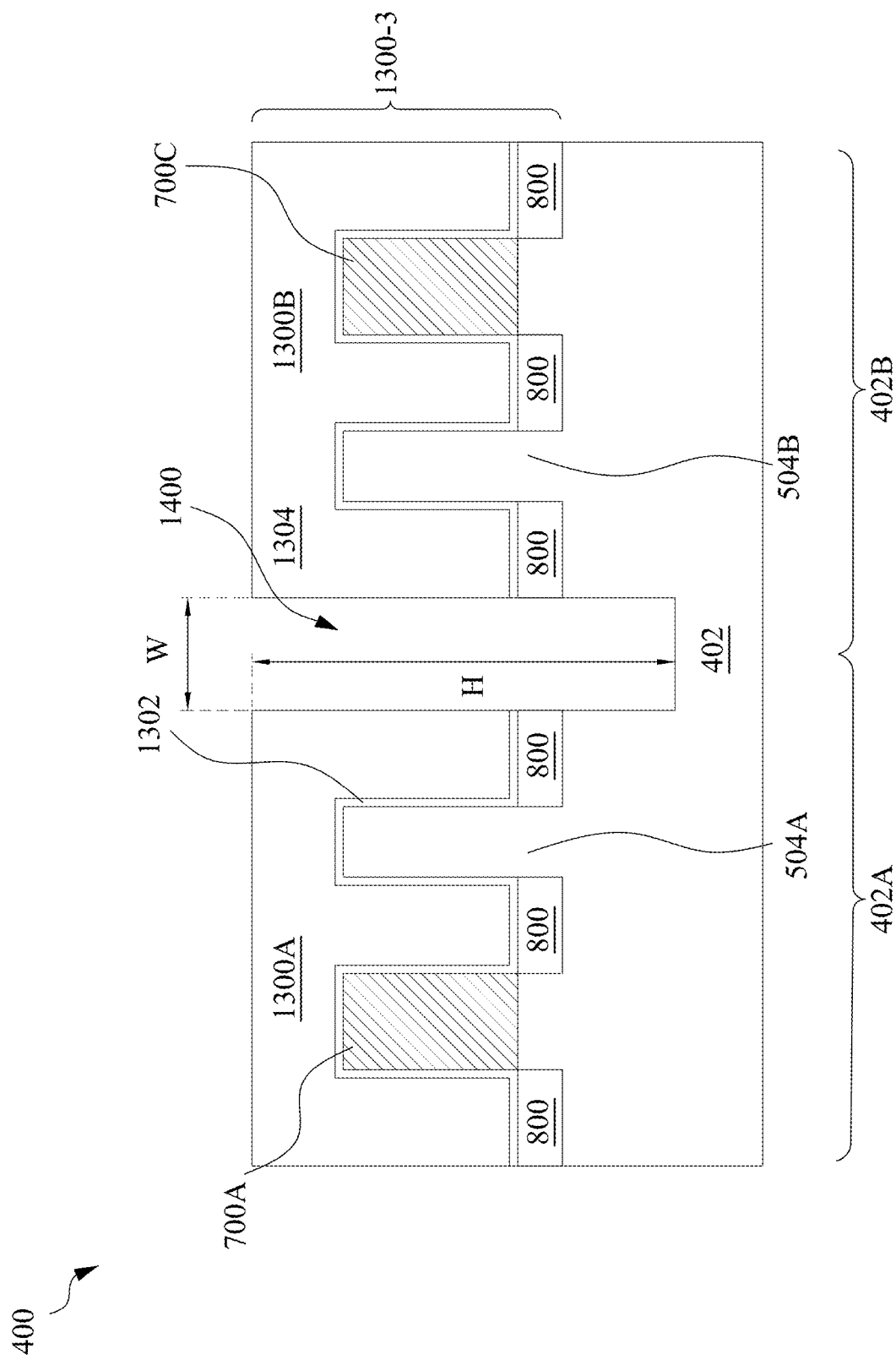

Corresponding to operation 322 of FIG. 3, FIG. 15A is a cross-sectional view of the FinFET device 400 in which the dummy fin 700B is removed at one of the various stages of fabrication. The view of FIG. 15A is cut along cross-section B-B, as indicated in FIGS. 1 and 2. Corresponding to the same operation 322, FIG. 15B is another cross-sectional view of the FinFET device 400 cut along cross-section C-C, as indicated in FIGS. 1 and 2.

After the dummy fin 700B is exposed by the trench 1400, as shown in FIGS. 14A-B, the dummy fin 700B may be removed by performing one or more etching processes through the trench 1400. For example, at least one anisotropic etching process (e.g., reactive ion etch (RIE), neutral beam etch (NBE), the like, or combinations thereof) may be performed to remove the dummy fin 700B using the trench 1400 as a window. Next, at least one isotropic etching process may be performed to remove residues. Consequently, the trench 1400 can be further extended by the one or more etching processes. As the trench 1400 is extended by the anisotropic etching process, the width, W, may be preserved. In some embodiments, while removing the dummy fin 700B, a portion of the gate dielectric layer 1302 extending along the sidewalls of the dummy fin 700B can also be removed, as shown in FIG. 15A. In some embodiments, the removal process of the dummy fin 700B may be extended to etch a portion of the substrate 402 beneath the dummy fin 700B, as shown in FIGS. 15A-B. In some embodiments, the trench 1400 may have a depth or height, H, which may range from about 30 nanometers (nm) and about 150 nm.

Figure 15B:
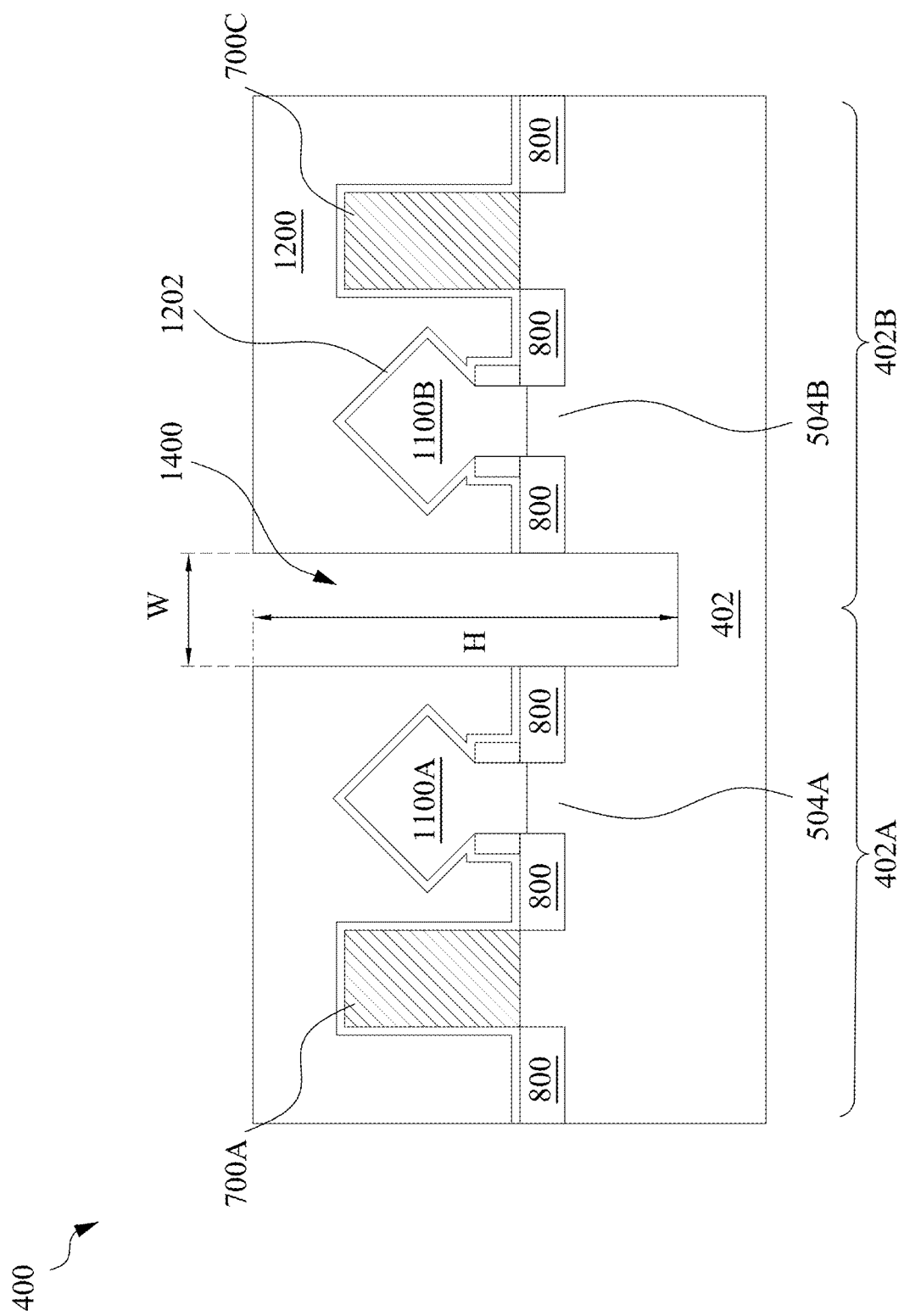

As prior to further extending the trench 1400 into the substrate 402 (prior to operation 322), the trench 1400 has been formed to laterally extend across the active gate structures 1300-1 to 1300-4 (and the ILD 1200 between adjacent active gate structures), upon performing operation 322, the trench 1400 can also be extended toward the substrate 402 between the source/drain region 1100A in the area 402A and the source/drain region 1100B in the area 402B, as shown in FIG. 15B. In some embodiments, the trench 1400 is extended between the source/drain regions 1100A and 1100B by removing the dummy fin 700B. In other words, as a result of further extending the trench 1400 toward the substrate 402 by removing the dummy fin 700B, the cells respectively disposed in the areas 402A and 402B can be separated by the (extended) trench 1400.

In some embodiments, the trench 1400 can have a relatively low aspect ratio, defined as the width (W) to the depth/height (H). For example, the aspect ratio may range from about ⅓ to about ¹⁄₁₅. The width of the trench 1400 may be controlled through the patterning process in operation 320 that cuts the active gate structures 1300; and the depth of the trench 1400 may be controlled through the etching process(es) in operation 322. For example, various operation conditions of the etching process(es) such as, time, temperature, pressure, etc., can be tuned to reach a desired value of the height. By forming such a trench with a low aspect ratio between the source/drain regions 1100A and 1100B, the source/drain regions 1100A and 1100B, which are strongly coupled to each other through the dielectric therebetween in the existing technologies, can be separated by an air void, which will be discussed as follows.

Figure 16A:
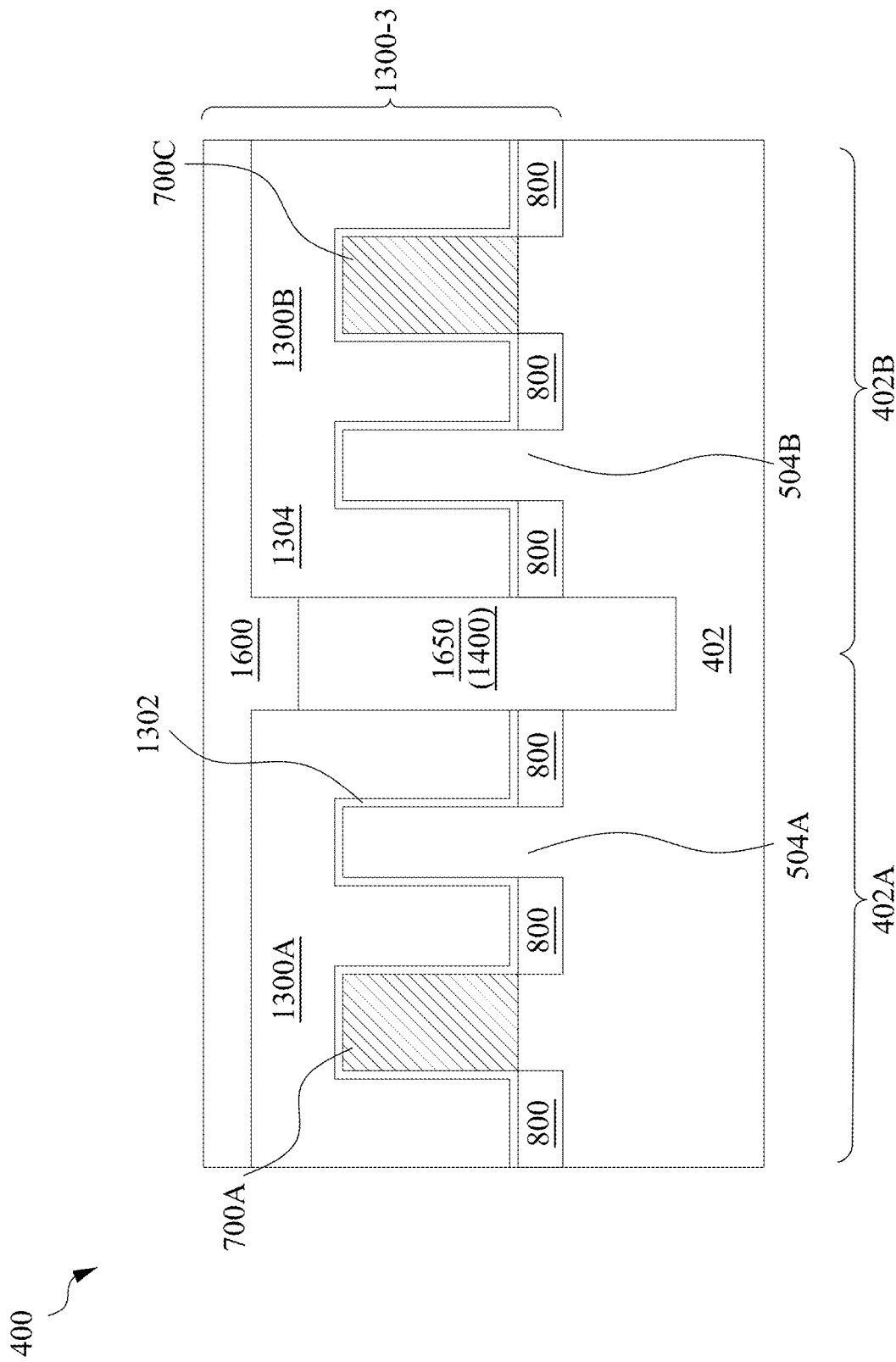
Figure 16B:
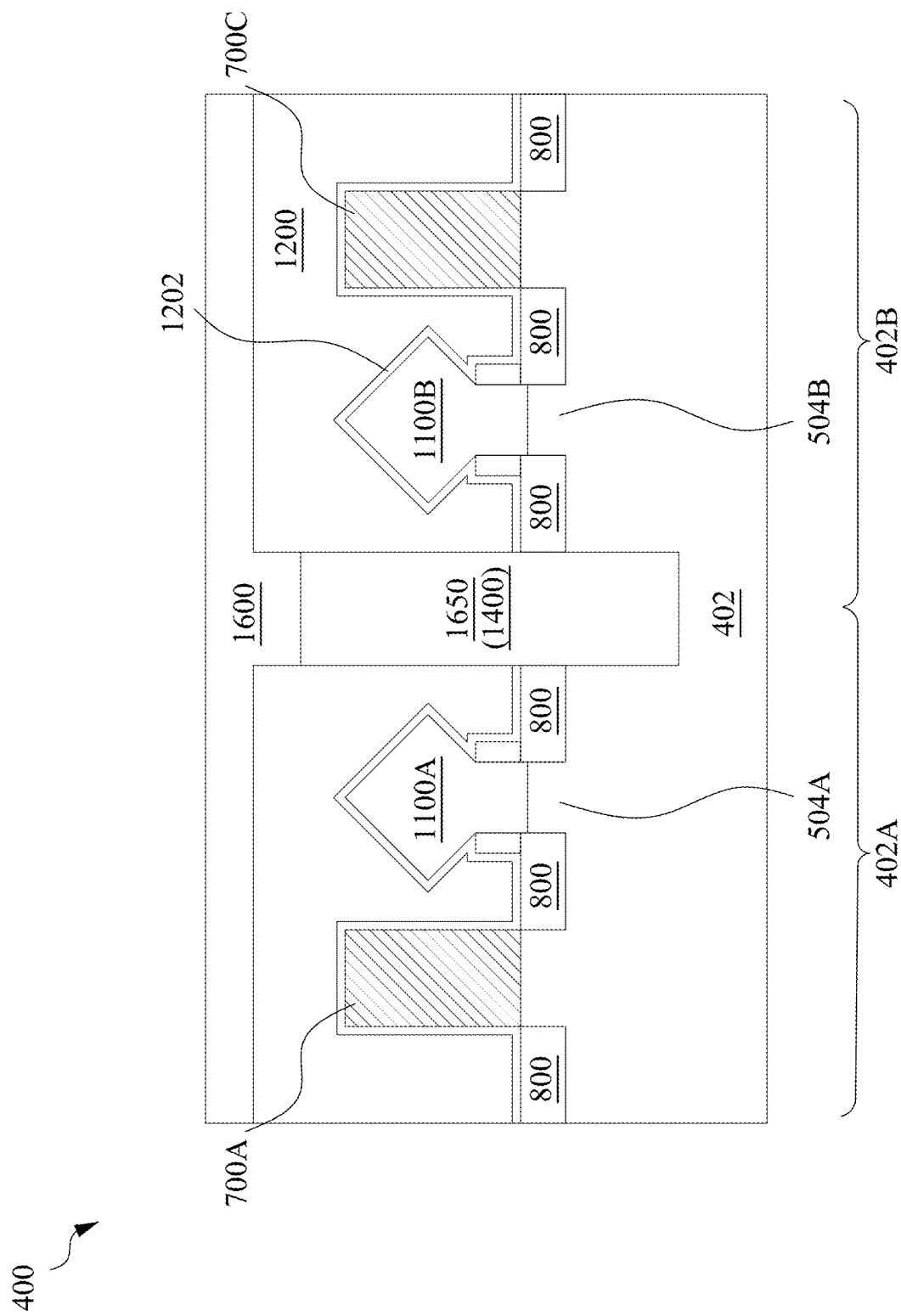

Corresponding to operation 324 of FIG. 3, FIG. 16A is a cross-sectional view of the FinFET device 400 including a dielectric protection layer 1600 at one of the various stages of fabrication. The view of FIG. 16A is cut along cross-section B-B, as indicated in FIGS. 1 and 2. Corresponding to the same operation 324, FIG. 16B is another cross-sectional view of the FinFET device 400 cut along cross-section C-C, as indicated in FIGS. 1 and 2.

The dielectric protection layer 1600 is formed over the substrate 402 to cap or seal the trench 1400. Given the low aspect ratio of the trench 1400, the dielectric protection layer 1600 may extend to only a top portion of the trench 1400, as shown in FIGS. 16A-B. In some other embodiments, the dielectric protection layer 1600 may not extend to any portion of the trench 1400. By capping the trench 1400 with the dielectric protection layer 1600, an air gap or void 1650 is formed between the semiconductor fins 504A-B and between the source/drain regions 1100A-B. The air void 1650 may extend between the areas 402A and 402B. Specifically, the air void 1650 may extend across the active gate structures 1300A-B and between the respective source/drain regions formed along the semiconductor fins 504A and 504B.

With the air void 1650 disposed between the two sets of source/drain regions formed along the semiconductor fins 504A and 504B, respectively, the cross-coupling between the two sets of source/drain regions can be significantly reduced due to the greatly reduced dielectric constant of a material disposed therebetween. For example, the dummy fin (with a dielectric constant of 3.9 or higher) that was disposed between the two sets of source/drain regions is now replaced by the air void (with a dielectric constant of 1). Consequently, the cross-coupling, which is positively proportional to the dielectric constant, can be reduced by, for example, at least 3.9 times.

The dielectric protection layer 1600 includes a dielectric material. The dielectric material may be, for example, silicon oxide, silicon nitride, silicon oxynitride, silicon carbide, silicon carbonitride, silicon oxycarbonitride, silicon oxycarbide, multilayers thereof, or the like. The dielectric protection layer 1600 can be formed by depositing the dielectric material over the substrate 402 using any suitable method, such as CVD, PECVD, or FCVD. After the deposition, a CMP may be performed to planarize the dielectric protection layer 1600.

Figure 17:
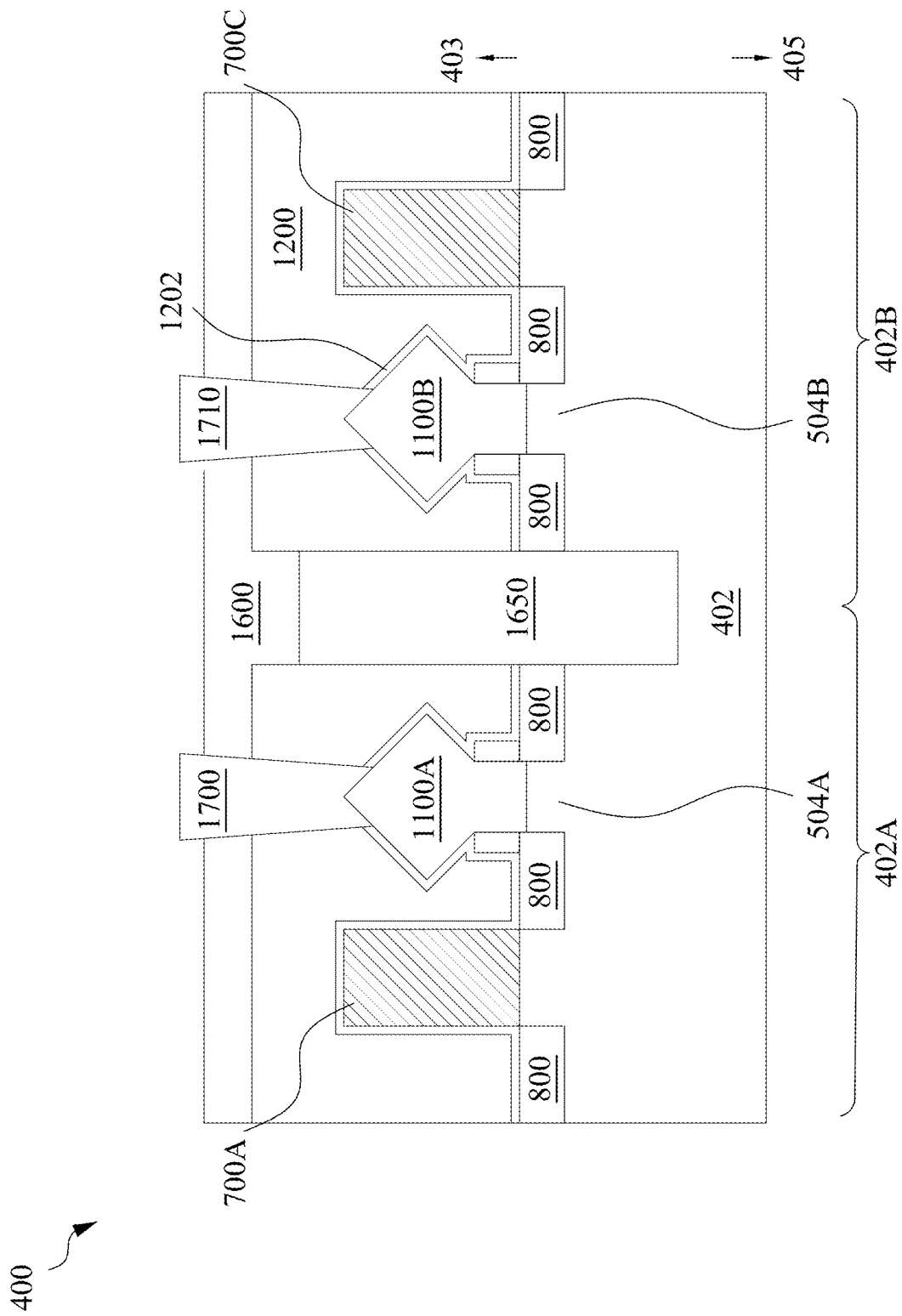

Corresponding to operation 326 of FIG. 3, FIG. 17 is a cross-sectional view of the FinFET device 400 including a number of interconnect structures, e.g., 1700, 1710, at one of the various stages of fabrication. The view of FIG. 17 is cut along cross-section C-C, as indicated in FIGS. 1 and 2.

The interconnect structures 1700-1710 are formed on a first side 403 of the substrate 402. The first side 403 may sometimes be referred to as "front side 403" of the substrate 402. Accordingly, the interconnect structures 1700-1710 may sometimes be referred to as front side interconnect structures 1700-1710. In various embodiments, the layout design 200 of FIG. 2 is used to form various features (e.g., the semiconductor fins 504A-B, the dummy fins 700A-C, the source/drain regions 1100, the active gate structures 1300) on the front side 403. Opposite to the front side 403, the substrate 402 has a second side 405. The second side 405 may sometimes be referred to as "back side 405" of the substrate 402.

As shown in FIG. 17, the front side interconnect structures 1700-1710, including one or more metal materials (e.g., copper, tungsten), are formed to electrically connect to the source/drain regions 1100A-B, respectively, by extending through the dielectric protection layer 1600, the ILD 1200, and the CESL 1202. The front side interconnect structures 1700-1710 can form a portion of a middle of the line (MOL) wiring network. It is appreciated that the illustrated embodiment of FIG. 17 is simplified, that is, each of the front side interconnect structures 1700-1710 can include one or more interconnect structures coupled to each other, while remaining within the scope of the present disclosure. For example, each of the front side interconnect structures 1700-1710 can include a lateral interconnect structure in contact with the source/drain regions 1100A-B (which is typically known as "MD") and a vertical interconnect structure in contact with the lateral interconnect structure (which is typically known as "VD"). In some embodiments, the front side interconnect structures 1700-1710 can electrically connect the source/drain regions 1100A-B to one or more metallization layers formed over the front side interconnect structures 1700-1710, which form a portion of a back end of the line (BEOL) wiring network. For simplicity, such metallization layers are omitted.

Figure 18:
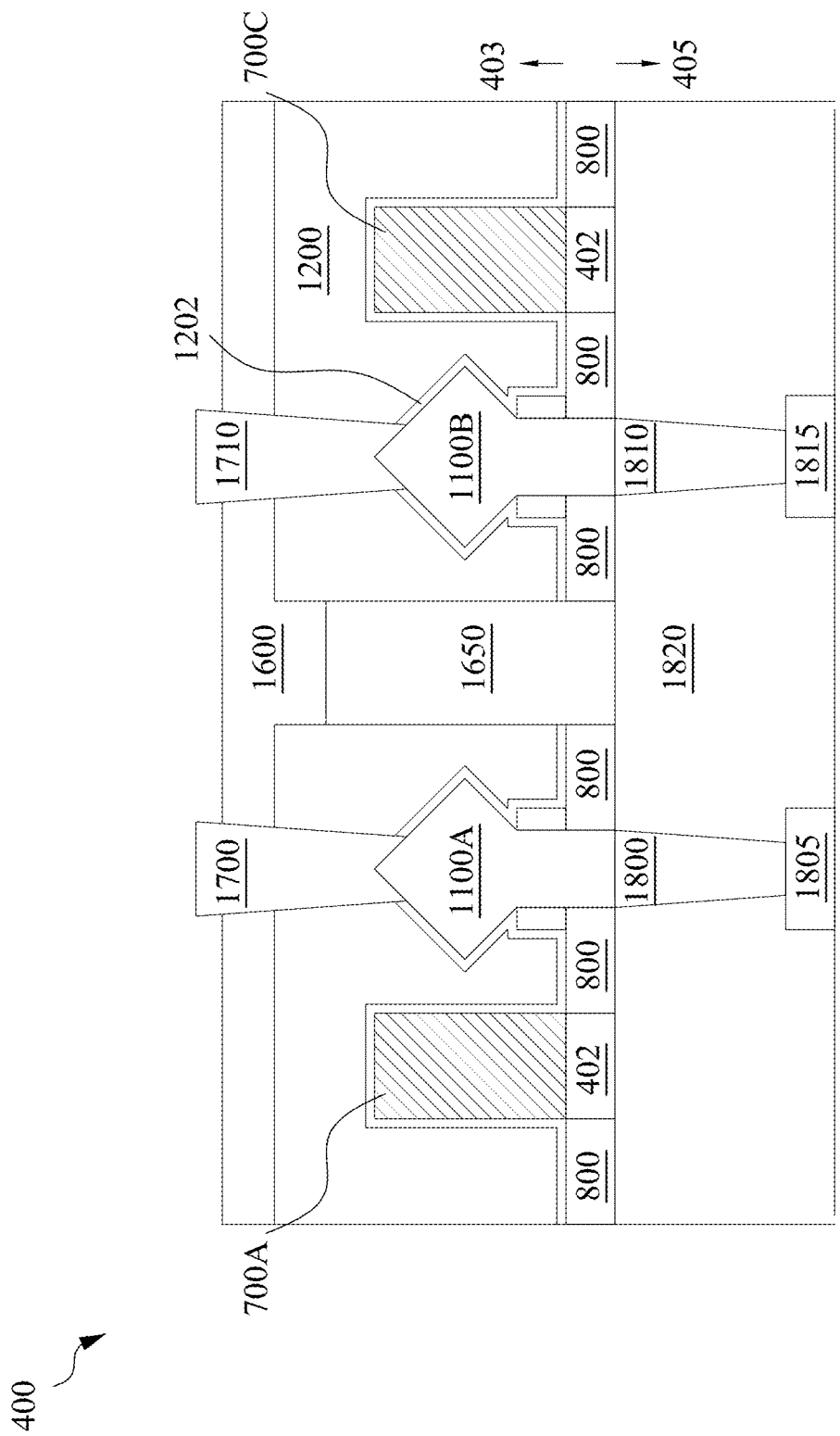

Corresponding to operation 328 of FIG. 3, FIG. 18 is a cross-sectional view of the FinFET device 400 including interconnect structures, e.g., 1800, 1805, 1810, 1815, at one of the various stages of fabrication. The view of FIG. 18 is cut along cross-section C-C, as indicated in FIGS. 1 and 2.

The interconnect structures 1800-1815 are formed on the back side 405 of the substrate 402. Accordingly, the interconnect structures 1800-1815 may sometimes be referred to as back side interconnect structures 1800-1815. In some embodiments, subsequently to forming the front side interconnect structures 1700-1710, the substrate 402 is flipped and then is thinned down from a surface on the back side 405 (hereinafter "back surface"). For example, the substrate 402 may be thinned until a bottom surface of the source/drain regions 1100A-B is exposed. Accordingly, an dielectric layer (e.g., an ILD) 1820 is formed over the back surface. Next, the back side interconnect structures 1800-1805 and 1810-1815, including one or more metal materials (e.g., copper, tungsten), are formed to electrically connect to the source/drain regions 1100A-B, respectively, by extending through the ILD 1820.

It is appreciated that the illustrated embodiment of FIG. 18 is simplified, that is, each of the back side interconnect structures 1800-1815 can include one or more interconnect structures coupled to each other, while remaining within the scope of the present disclosure. For example, each of the back side interconnect structures 1800-1815 can include a lateral interconnect structure in contact with the source/drain regions 1100A-B and a vertical interconnect structure in contact with the lateral interconnect structure. Further, in some embodiments, the interconnect structures 1805 and 1815 can be configured as power rails. For example, the interconnect structure 1805 may be configured as a high voltage power rail to provide VDD, and the interconnect structure 1815 may be configured as a low voltage power rail to provide VSS (ground).

Figure 19:
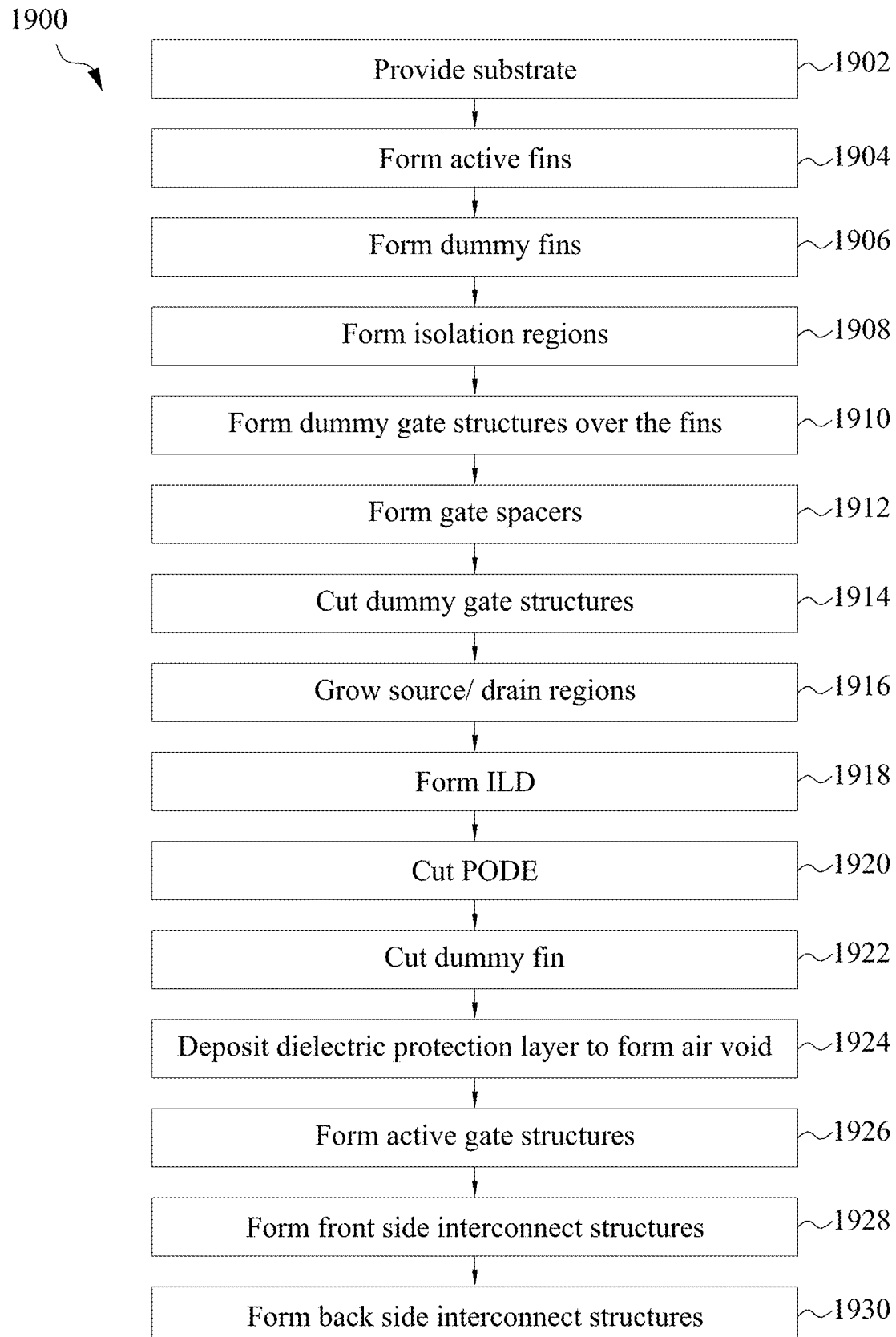
FIG. 19 illustrates a flow chart of another example method for making a non-planar transistor device, in accordance with some embodiments.

FIG. 19 illustrates a flowchart of another method 1900 to form a non-planar transistor device that includes an air void separating two abutted cells, according to one or more embodiments of the present disclosure. It is noted that some of the operations of the method 1900 are similar to those of the method 300, and thus, the following discussion of the method 1900 will be focused on the different operations. Further, as the device made by the method 1900 is similar to the FinFET device 400, the method 1900 will be discussed in conjunction with FIGS. 1-2 and 4-18.

For example, operations 1902, 1904, 1906, 1908, 1910, and 1912 of the method 1900 are similar to operations 302, 304, 306, 308, 310, and 312 of the method 300, respectively. Upon performing operation 1912, a number of dummy gate structures (e.g., 240-246 in FIGS. 2 and 900-1-4 in FIG. 10) are formed over a number of semiconductor fins (e.g., 222 and 224 in FIGS. 2 and 504A-B in FIG. 9) and dummy fins (e.g., 230-234 in FIGS. 2 and 700A-C in FIG. 9), wherein each of the dummy gate structures extends across the semiconductor fin(s) and dummy fin(s) disposed in the respective two areas (e.g., 402A-B in FIGS. 4-10) or cells (210A-B in FIG. 2) and the dummy fin (e.g., 232 in FIGS. 2 and 700B in FIG. 9) disposed between the areas/cells. Next at operation 1914, different from the method 300, each of the dummy gate structures is cut into two portions respectively disposed in the two areas. Operation 1914 is similar to operation 320 except that the material of the gate structures to be cut. Thus, it is understood that the dummy fin 232/700B may not be overlaid by any of the dummy gate structures 240-246/900-1-4 after operation 1914 being performed. Next, operations 1916 and 1918 are similar to operations 316 and 318, respectively. As such, upon performing operation 1918, source/drain regions (e.g., 222-1-3, 224-1-3 in FIGS. 2 and 1100A-B in FIG. 11B) formed along each of the semiconductor fins 222-224/504A-B and on respective sides of each of the dummy gate structures 240-246/900-1-4 are overlaid by an ILD (e.g., 1200 in FIGS. 12A-B). Next, at operation 1920, the dummy gate structures, configured as PODEs, (e.g., 240 and 246 in FIGS. 2 and 900-1 and 900-4 in FIG. 10) are cut. In some embodiments, when cutting the PODEs, the PODEs and the underlying portions of each of the fins are also removed. Next, operation 1922 in which the dummy fin 232/700B is cut and the following operations 1924-1930 are similar to operations 322, 324, 318, 326, and 328, respectively. Thus, the discussions are not repeated.

Figure 20:
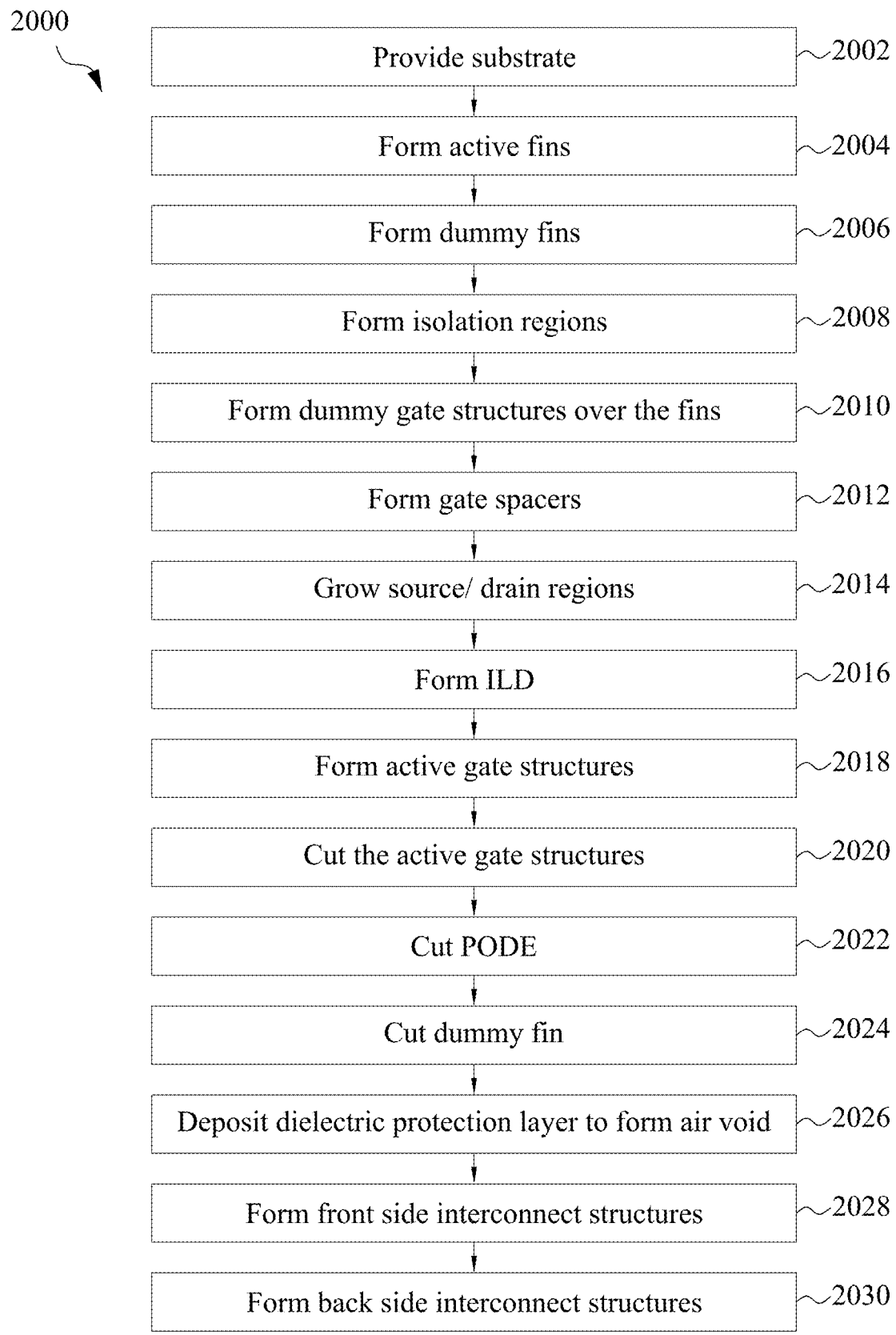
FIG. 20 illustrates a flow chart of yet another example method for making a non-planar transistor device, in accordance with some embodiments.

FIG. 20 illustrates a flowchart of yet another method 2000 to form a non-planar transistor device that includes an air void separating two abutted cells, according to one or more embodiments of the present disclosure. It is noted that some of the operations of the method 2000 are similar to those of the method 300, and thus, the following discussion of the method 2000 will be focused on the different operations. Further, as the device made by the method 2000 is similar to the FinFET device 400, the method 2000 will be discussed in conjunction with FIGS. 1-2 and 4-18.

For example, operations 2002, 2004, 2006, 2008, 2010, 2012, 2014, 2016, 2018, and 2020 of the method 2000 are similar to operations 302, 304, 306, 308, 310, 312, 314, 316, 318, and 320 of the method 300, respectively. Upon performing operation 2018, a number of active gate structures (e.g., 240-246 in FIGS. 2 and 1300-1-4 in FIG. 13A) are formed over a number of semiconductor fins (e.g., 222 and 224 in FIGS. 2 and 504A-B in FIG. 9) and dummy fins (e.g., 230-234 in FIGS. 2 and 700A-C in FIG. 9), wherein each of the active gate structures extends across the semiconductor fin(s) and dummy fin(s) disposed in the respective two areas (e.g., 402A-B in FIGS. 4-10) or cells (210A-B in FIG. 2) and the dummy fin (e.g., 232 in FIGS. 2 and 700B in FIG. 9) disposed between the areas/cells. Next at operation 2020, each of the dummy gate structures is cut into two portions respectively disposed in the two areas. Next, at operation 2022, the active gate structures, configured as PODEs, (e.g., 240 and 246 in FIGS. 2 and 1300-1 and 1300-4 in FIG. 13A) are cut. In some embodiments, when cutting the PODEs, the PODEs and the underlying portions of each of the fins are also removed. Next, operation 2024 in which the dummy fin 232/700B is cut and the following operations 2026-2030 are similar to operations 322, 324, 326, and 328, respectively. Thus, the discussions are not repeated.

In one aspect of the present disclosure, a semiconductor device is disclosed. The semiconductor device includes a semiconductor substrate. The semiconductor device includes a first fin protruding from the semiconductor substrate and extending along a first direction. The semiconductor device includes a second fin protruding from the semiconductor substrate and extending along the first direction. A first epitaxial source/drain region coupled to the first fin and a second epitaxial source/drain region coupled to the second fin are laterally spaced apart from each other by an air void.

In another aspect of the present disclosure, a semiconductor device is disclosed. The semiconductor device includes a semiconductor substrate having a first side and a second side opposite to each other. The semiconductor device includes a first transistor, formed on the first side, that includes a first source/drain region protruding from the first side. The semiconductor device includes a second transistor, formed on the first side and adjacent to the first transistor, that includes a second source/drain region protruding from the first side. The first source/drain region and the second source/drain region are spaced apart from each other along a first lateral direction by an air void.

In yet another aspect of the present disclosure, a method of forming a semiconductor device is disclosed. The method includes forming a first semiconductor fin and a second semiconductor fin over a substrate. The first and second semiconductor fins extend along a first direction. The method includes forming a dielectric fin also extended along the first direction, the dielectric fin disposed between the first and second semiconductor fins. The method includes forming a first dummy gate structure that extends along a second direction perpendicular to the first direction, and straddles the first semiconductor fin, the dielectric fin, and the second semiconductor fin. The method includes forming a first pair of source/drain regions in the first semiconductor fin on sides of the first dummy gate structure and a second pair of source/drain regions in the second semiconductor fin on sides of the first dummy gate structure. The method includes overlaying the first pair of source/drain regions and the second pair of source/drain regions with a dielectric layer. The method includes removing the dielectric fin. The method includes depositing a protection layer over the dielectric layer to form an air void separating the first pair of source/drain regions and the second pairs of source/drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first cell formed on a substrate, and comprising at least one first active region extending along a first direction and a plurality of first gate structures extending along a second direction; and
   a second cell formed on the substrate, and comprising at least one second active region extending along the first direction and a plurality of second gate structures extending along the second direction; and
   an air void interposed between the first cell and the second cell along the second direction, and further interposed between each of the plurality of first gate structures and a corresponding one of the plurality of second gate structures,
   wherein a ratio of a width of the air void along the second direction to a height of the air void along a third direction perpendicular to the first and second directions ranges from about $1/3$ to about $1/15$.

2. The semiconductor device of claim 1, wherein the air void partially extends into the substrate.

3. The semiconductor device of claim 1, wherein the at least one first active region further comprises a plurality of first epitaxial source/drain regions, and the at least one second active region comprises a plurality of second epitaxial source/drain regions.

4. The semiconductor device of claim 3, wherein the air void is interposed between each of the plurality of first epitaxial source/drain regions and a corresponding one of the plurality of second epitaxial source/drain regions.

5. The semiconductor device of claim 1, wherein the first and second cells are disposed on a first side of the semiconductor substrate.

6. The semiconductor device of claim 5, further comprising at least one conductive power rail disposed on a second side of the semiconductor substrate, the second side being opposite to the first side.

7. The semiconductor device of claim 1, wherein a height of the air void is between about 30 nanometers (nm) and about 150 nm.

8. The semiconductor device of claim 1, wherein the first cell further comprises a first dummy region disposed opposite the at least one first active region from the air void along the second direction, and the second cell further comprises a second dummy region disposed opposite the at least one second active region from the air void along the second direction.

9. The semiconductor device of claim 8, wherein the plurality of first gate structures traverse the first dummy region, and the plurality of second gate structures traverse the second dummy region.

10. A semiconductor device, comprising:
    a first cell formed on a substrate, and comprising at least one first active region extending along a first direction and a plurality of first gate structures extending along a second direction; and
    a second cell formed on the substrate, and comprising at least one second active region extending along the first direction and a plurality of second gate structures extending along the second direction; and
    an air void interposed between the first cell and the second cell along the second direction, and further interposed between each of the plurality of first gate structures and a corresponding one of the plurality of second gate structures;
    wherein the air void partially extends into the substrate and wherein a height of the air void is between about 30 nanometers (nm) and about 150 nm.

11. The semiconductor device of claim 10, wherein the at least one first active region further comprises a plurality of first epitaxial source/drain regions, and the at least one second active region comprises a plurality of second epitaxial source/drain regions.

12. The semiconductor device of claim 11, wherein the air void is interposed between each of the plurality of first epitaxial source/drain regions and a corresponding one of the plurality of second epitaxial source/drain regions.

13. The semiconductor device of claim 10, wherein a ratio of a width of the air void along the second direction to a height of the air void along a third direction perpendicular to the first and second directions ranges from about ⅓ to about 1/15.

14. The semiconductor device of claim 10, wherein the first and second cells are disposed on a first side of the semiconductor substrate.

15. The semiconductor device of claim 14, further comprising at least one conductive power rail disposed on a second side of the semiconductor substrate, the second side being opposite to the first side.

16. A semiconductor device, comprising:
   a first cell formed on a first side of a substrate, and comprising:
      a first active region extending along a first direction;
      a plurality of first gate structures extending along a second direction; and
      a first dummy region disposed next to the first active region along the second direction;
   a second cell formed on the first side of the substrate, and comprising:
      a second active region extending along the first direction;
      a plurality of second gate structures extending along the second direction; and
      a second dummy region disposed next to the second active region along the second direction; and
   an air void interposed between the first active region and the second active region along the second direction, and further interposed between each of the plurality of first gate structures and a corresponding one of the plurality of second gate structures.

17. The semiconductor device of claim 16, wherein the air void partially extends into the substrate.

18. The semiconductor device of claim 16, further comprising at least one conductive power rail disposed on a second side of the semiconductor substrate, the second side being opposite to the first side.

19. The semiconductor device of claim 16, wherein a ratio of a width of the air void along the second direction to a height of the air void along a third direction perpendicular to the first and second directions ranges from about ⅓ to about 1/15.

20. The semiconductor device of claim 16, wherein a height of the air void is between about 30 nanometers (nm) and about 150 nm.

* * * * *